United States Patent [19]

Kajigaya et al.

[11] Patent Number: 5,018,101
[45] Date of Patent: May 21, 1991

[54] SEMICONDUCTOR MEMORY

[75] Inventors: Kazuhiko Kajigaya; Hiroaki Kotani; Kazuyoshi Oshima, all of Ohme; Yasuhiro Kasama, Tokyo; Shinji Udo, Akishima, all of Japan

[73] Assignees: Hitachi, Ltd.; Hitachi VLSI Engineering Corp., both of Tokyo, Japan

[21] Appl. No.: 575,658

[22] Filed: Aug. 31, 1990

Related U.S. Application Data

[63] Continuation of Ser. No. 228,228, Aug. 4, 1988, Pat. No. 4,956,811.

[30] Foreign Application Priority Data

Sep. 16, 1987 [JP] Japan ................... 62-231640
Sep. 16, 1987 [JP] Japan ................... 62-231641

[51] Int. Cl.$^5$ ............................................ G11C 13/00
[52] U.S. Cl. ............................. 365/51; 365/96; 365/189.01; 365/63

[58] Field of Search .................... 365/51, 52, 63, 72, 365/96, 189.01, 230.01

[56] References Cited

U.S. PATENT DOCUMENTS 4,825,418  4/1989  Itoh et al. ..................... 365/51
4,956,811  9/1990  Kajigaya et al. .............. 365/51
4,958,316  9/1990  Ochii et al. ................... 365/63

Primary Examiner—Terrell W. Fears
Attorney, Agent, or Firm—Antonelli, Terry, Stout & Kraus

[57] ABSTRACT

A semiconductor memory wherein an operating mode is selectively set by effecting bonding with respect to predetermined pads provided on a common semiconductor substrate in a predetermined combination or by cutting off predetermined fuse means provided on the common semiconductor substrate in a predetermined combination and a bit pattern is selectively set by changing a part of a photomask applied to the common semiconductor substrate.

6 Claims, 38 Drawing Sheets

FIG. 34(1)

| Figure Number | Block Name | | Signal Name | 1 (31) | 2 | 3 | 4 | 5 |
|---|---|---|---|---|---|---|---|---|
| 1 (31) | COM | | SC | △ | | | | |
| | | | SR | △ | | | | |
| | | | NE | △ | | | | |
| | | | MS | △ | | | | |
| 2 | | | DL | △ | | | | |
| | | | YL | △ | | | | |
| | | | $\overline{OL}$ | | | | | |
| | | | ME | | | | | |
| | | | NR | | | | | |
| 3 | | | TE | | | | | |
| | | | MT | | | | | |
| 5 | | | RN | | △ | | | △ |
| | | | RF | | | | | △ |
| | | | CF | | | | | △ |
| | | | $\overline{RFD}$ | | | △ | | |
| | | | $\overline{RND}$ | | | | | |
| | | | CE | | | | | |
| | | | WLT | | | | | |
| 6 | TG | RTG | R1 | | △ | △ | | △ |
| | | | R2 | | | | | △ |
| | | | R3 | | | | | |
| | | | P1 | | | | | |
| | | | P2 | | | | | |
| | | | P3 | | | | | |
| | | | RG | | | | | △ |
| | | | RE | | | | | |
| | | | R3M | | | | | |
| | | | P1L-P2L | | | | | |
| | | | P1R-P2R | | | | | |
| | | | $\overline{P2L}$-$\overline{P3L}$ | | | | | |
| | | | $\overline{P2R}$-$\overline{P3R}$ | | | | | |
| | | | $\overline{PCL}$ · $\overline{PCR}$ | | | | | |
| 7 | | CTG | C1 | | △ | △ | | △ |
| | | | $\overline{C1}$ | | △ | | | |
| | | | C2 | | △ | | | |
| | | | $\overline{C2}$ | | | | | |
| | | | YP | | | | | |
| | | | RYP | | | | | |
| | | | $\overline{RYP}$ | | | | | |

FIG. 34(3)

| 21 22 23 24 25 | 26 27 28 29 30 | EXTERNAL TERMINAL·PAD·FUSE |
|---|---|---|
|  |  | FP0. FP1.(F1. F2) |
|  | △ |  |
| △ |  |  |
|  | △ △<br>△ |  |
|  | △ △ △ | TF |
|  |  |  |
| △ | △ | $\overline{RAS}$ |
|  | △ |  |
|  | △<br>△<br>△ |  |
|  |  | $\overline{CAS}$ |

FIG. 35(1)

| FIGURE NUMBER | BLOCK NAME | | SIGNAL NAME |
|---|---|---|---|
| 7 | | CTG | MA<br>DS |
| 8 | | OTG | DOE |
| 9 | TG | WTG | WE2<br>WR<br>WF<br>$\overline{W1}$<br>$\overline{W2}$<br>$\overline{W3}$<br>IOU<br>WYP<br>$\overline{WYP}$ |
| 10 | RADB | | A0~A9<br>BX0~BX9<br>$\overline{BX0}$~$\overline{BX9}$<br>R2S<br>XL. $\overline{XL}$<br>AX8. $\overline{AX8}$<br>AX8H. $\overline{AX8H}$<br>AX8HU. $\overline{AX8HU}$<br>AX8HUM. $\overline{AX8HUM}$ |
| 11 | PRDCR | | $\overline{PC}$<br>XDP<br>$\overline{PCH}$<br>X<br>XBM |
| 12 | | | X00. X01. X10. X11<br>XR0. XR1 |
| 13 | | | WCL0~WCL3<br>AX20~AX23<br>AX40~AX43<br>AX60~AX63 |
| 14 | RCTR | | AR0~AR8 |
| 15 | RDCR0~RDCR3 | | X0~X255<br>RW0L. RW1L<br>DW0L~DW3L |
| 16 | NCTR | | AXY0~AXY3. $\overline{AXY3}$<br>AXY3D |

FIG. 35(3)

| 21 22 23 24 25 | 26 27 28 29 30 | EXTERNAL TERMINAL·PAD·FUSE |
|---|---|---|
|  | △<br>△ △ |  |
|  | △ | $\overline{OE}(A9)$ |
|  |  | $\overline{WE}$ |
|  | △<br>△ |  |
|  |  | A0 ~ A8<br>A9($\overline{OE}$) |
| △ △<br>△ △ |  |  |
|  | △ |  |
| △ |  |  |
|  |  |  |
|  | △ |  |
|  |  |  |
|  | △<br>△<br>△ |  |
|  | △ △ |  |

FIG. 36(1)

| FIGURE NUMBER | BLOCK NAME | SIGNAL NAME |
|---|---|---|
| 17 | CADB(SCTR) | BY0 - BY9<br>$\overline{BY0}$ - $\overline{BY9}$<br>CY0 - CY7 |
| 18 | ATD | $\overline{AC1}$ |
| 19 | PCDCR | AY20L - AY23L<br>AY40L - AY41L<br>AY50L - AY53L<br>AY70L - AY73L<br>AY20R - AY23R<br>AY40R - AY41R<br>AY50R - AY53R<br>AY70R - AY73R |
| 20 | | $\overline{Y00L}$ - $\overline{Y11L}$<br>$\overline{Y00R}$ - $\overline{Y11R}$<br>$\overline{YR0L}$ - $\overline{YR1L}$<br>$\overline{YR0R}$ - $\overline{YR1R}$ |
| 21 | DIB1 - DIB4 | DI0 - DI3<br>$\overline{DI0}$ - $\overline{DI3}$<br>$\overline{M0}$ - $\overline{M3}$ |
| 22 | CDCR0 - CDCR1 | YS0L - YS511L |
| 23 | RAC | XRD0 - XRD1<br>XRD<br>YRD0 - YRD1<br>$\overline{YRD}$ |
| 24 | RAC(XRC0) | $\overline{XAC0}$<br>XEN0 |
| 25 | MARY0 - MARY3<br>(SAN0, SAP0, CS0) | I00L - I03L, $\overline{I00L}$ - $\overline{I03L}$<br>(I00R - I03R, $\overline{I00R}$ - $\overline{I03R}$) |
| 26 | MA0 - MA7 | M00 - M03, $\overline{M00}$ - $\overline{M03}$<br>DI0 - DI3, $\overline{DI0}$ - $\overline{DI3}$ |
| 27 | TL0 - TL1<br>DOB1 - DOB4 | mP0 - mP3 |
| 28 | | $\overline{WK}$ |
| 29 | VG | VBB<br>VL<br>$\overline{VBT}$<br>OSC |
| 30 | | VPL<br>HVC |

FIG. 36(2)

| 1(31) | 2 | 3 | 4 | 5 | 6 | 7 | 8 | 9 | 10 | 11 | 12 | 13 | 14 | 15 | 16 | 17 | 18 | 19 | 20 |
|---|---|---|---|---|---|---|---|---|---|---|---|---|---|---|---|---|---|---|---|
| | | | | | | | | | | | | | | | △ | | △ | △ | △ |
| | | | | | | | | | | | | | | | | | △ | △ | △ |
| | | | | | | | | | | | | | | | △ | | | | |
| | | | | | △ | | | | | | | | | | | | | | |
| | | | | | | | | | | | | | | | | | | | |
| | | | | | | | | | | | | | | | | | | | |
| | | | | | | | | | | | | | | | | | | | |
| | | | | | | | | | | | △ | | | | | | | | |
| | | | | | | | | | | | △ | | | | | | | | |
| | | | | | | | | | | | | | | | | | | △ | |
| | | | | | | | | | | | | | | | | | | △ | |
| | | | | | | | | | | | | | | | | | | | |
| | | | | △ | | △ | | | | | | | | | | | | | |
| | | | | | | | | | | | △ | | | | | | | | |
| | | | | | | | | | | | △ | | | | | | | | |

FIG. 36(3)

| 21 22 23 24 25 | 26 27 28 29 30 | EXTERNAL TERMINAL·PAD·FUSE |
|---|---|---|
| △<br>△ | | |
| △<br>△<br>△<br>△ | | |
| △ | | |
| | △<br>△<br>△ | Din. Dout (D1-D4) |
| | △ | |
| | | P1-P7 |
| △<br>△ | | |
| | △<br>△ | |
| △ | △ △ | |
| | △ | |
| | | Din. Dout (D1-D4) |
| △ △ | | |
| | △ △<br>△<br>△ | VBT<br>VBB |
| | △<br>△ | VPLG<br>VPL |

SEMICONDUCTOR MEMORY

This is a continuation of application Ser. No. 228,228, filed Aug. 4, 1988 now U.S. Pat. No. 4,956,811.

BACKGROUND OF THE INVENTION

The present invention relates to a semiconductor memory and, more particularly, to a technique which may be effectively applied, for example, to dynamic type RAMs (Random Access Memories) or the like which are designed so that it is possible to achieve expansion of type on the basis of a common semiconductor substrate (base chip).

There is one type of dynamic RAM which enables selection of various kinds of operating mode, for example, static column mode, page mode, etc., and also selection of units in which storage data is input and output, that is, bit patterns, according to customer's needs. This type of dynamic RAM is arranged such that operating modes and bit patterns are simultaneously changed simply by changing a part of a photomask applied to a common semiconductor substrate or by selectively effecting bonding between predetermined pads, by way of example.

SUMMARY OF THE INVENTION

The inventors of the present application have revealed that, as the memory capacity and operating speed of dynamic RAMs increase and the operating modes thereof are diversified, the following problems have been experienced with the above-described conventional method wherein the operating modes and bit patterns are changed simply by changing a part of a photomask applied to a common semiconductor substrate or by selectively effecting bonding between predetermined pads.

Namely, in the case where operating modes and bit patterns are changed simply by changing a part of photomask applied to a common semiconductor substrate, it is necessary to prepare a large number of different kinds of photomask so that desired expansion of type is enabled, and this leads to an increase in the development manhour and also complicates the management of masks. Further, since change of photomasks is usually carried out in the middle of a manufacturing process, it is difficult to cope with an urgent change of type. On the other hand, in the case where operating modes and bit patterns are changed simply by selectively effecting bonding between predetermined pads, the above-described problems are eliminated, but the number of required bonding pads increases and the chip area also increases instead. Since it is necessary in order to change bit patterns to alter the input/output path of storage data, gates or the like must be added to the input/output path so that the altered input/output path can work as desired. This prevents optimization of the signal path in the dynamic RAM and limits the reduction in the access time.

Dynamic RAMs are described, for example, in "Nikkei Electronics", June 3, 1985, Nikkei McGraw-Hill, pp. 209 to 231.

It is an object of the present invention to provide a semiconductor memory such as a dynamic type RAM or the like which is designed so that it is possible to effect efficient expansion of type without lowering the operating characteristics.

The above and other objects and novel features of the present invention will become apparent from the following description of the preferred embodiments thereof taken in conjunction with the accompanying drawings.

The following is a brief summary of a principal one of the inventions disclosed in the present application.

According to the invention, an operating mode of a dynamic type RAM or the like is set by selectively carrying out bonding between predetermined pads on a common semiconductor substrate (base chip) and a bit pattern of the RAM is set by selectively changing a part of a photomask applied to the common semiconductor substrate.

By virtue of the above-described means, it is possible to change over operating modes from one to another by selectively carrying out bonding between predetermined pads without the need to change photomasks and it is also possible to change over bit patterns from one to another by changing a part of a photomask without lowering signal transmission characteristics of the circuit. Accordingly, expansion of type of a dynamic type RAM or the like can be efficiently realized without wastefully increasing the number of bonding pads or photomasks and without lowering operating characteristics such as access time.

BRIEF DESCRIPTION OF THE DRAWINGS

Figure 36(2):
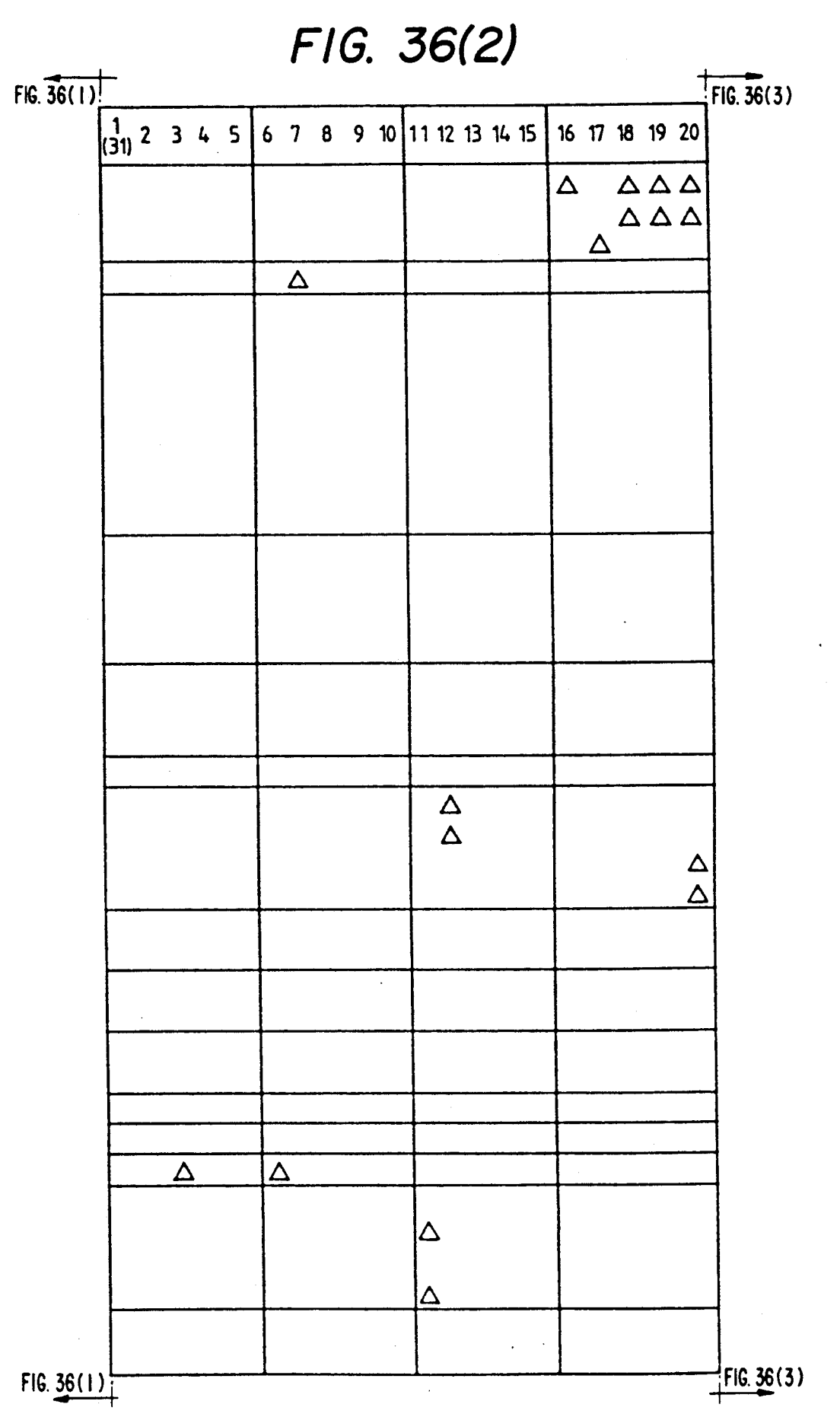

FIGS. 34 to 36 are tables showing signals in various blocks of a dynamic type RAM to which the present invention is applied.

DESCRIPTION OF THE PREFERRED EMBODIMENTS

EXAMPLE 1

Figure 32:
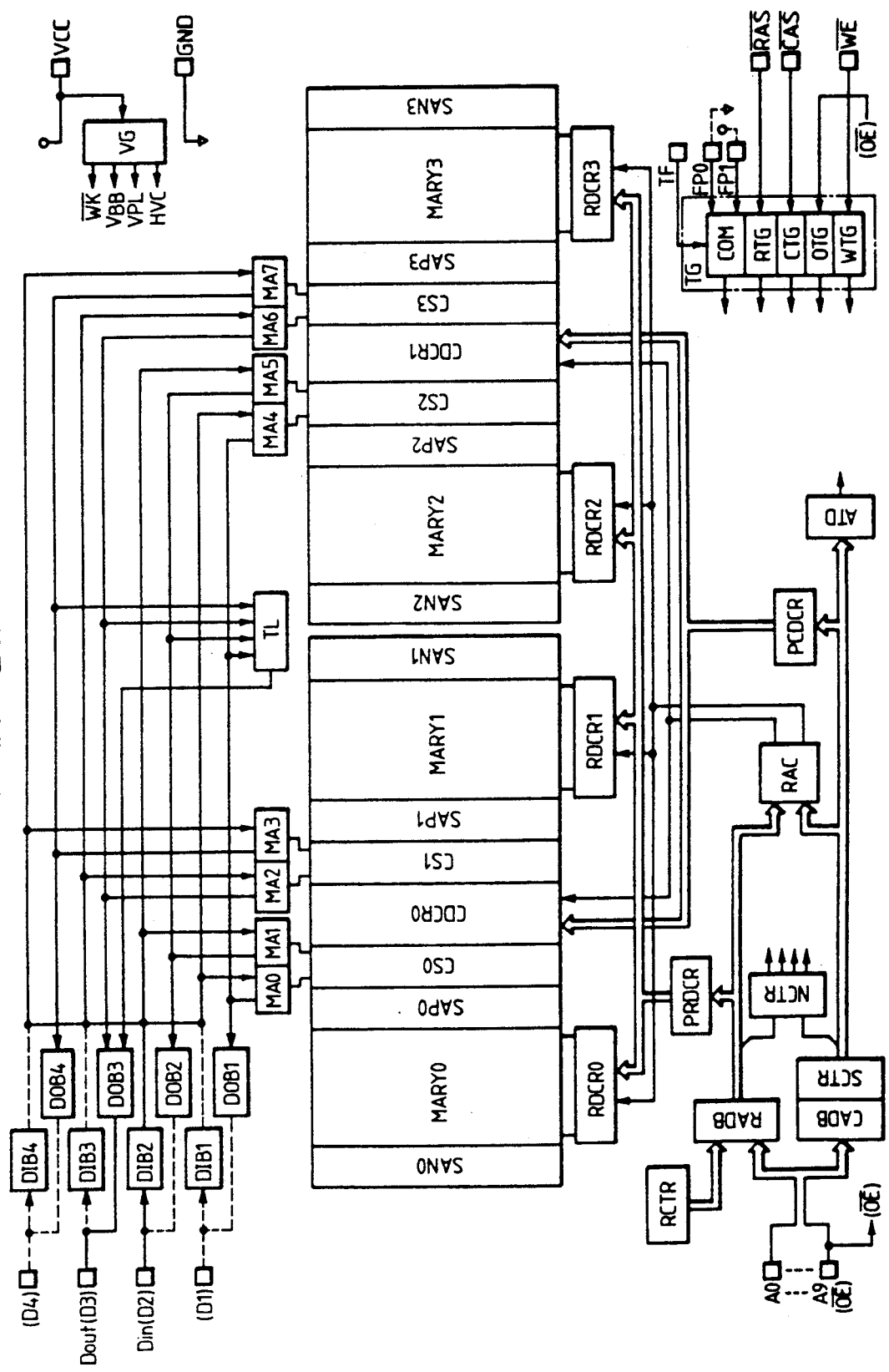
FIG. 32 is a block diagram showing one example of a dynamic type RAM to which the present invention is applied.
Figure 34:
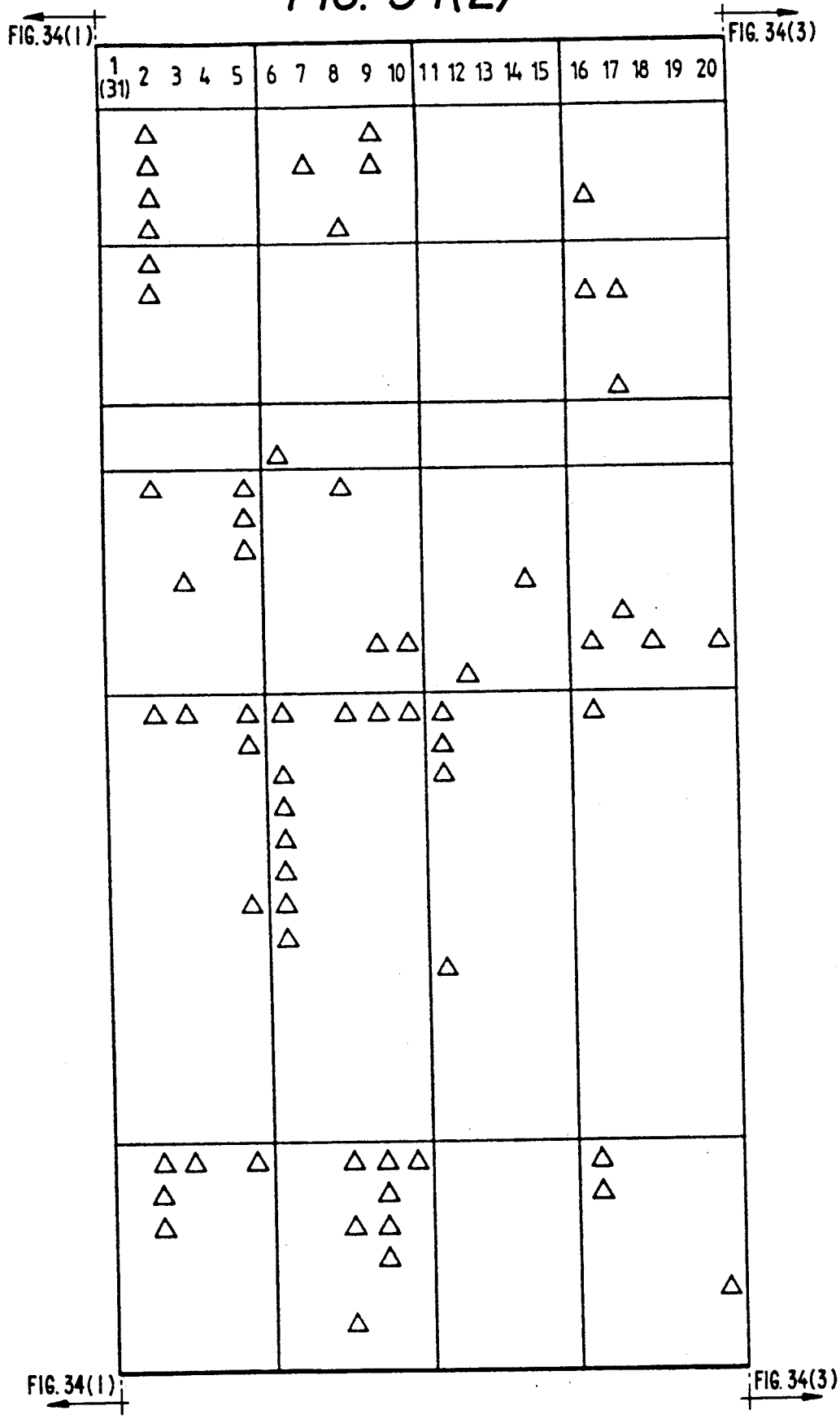
Figure 35:
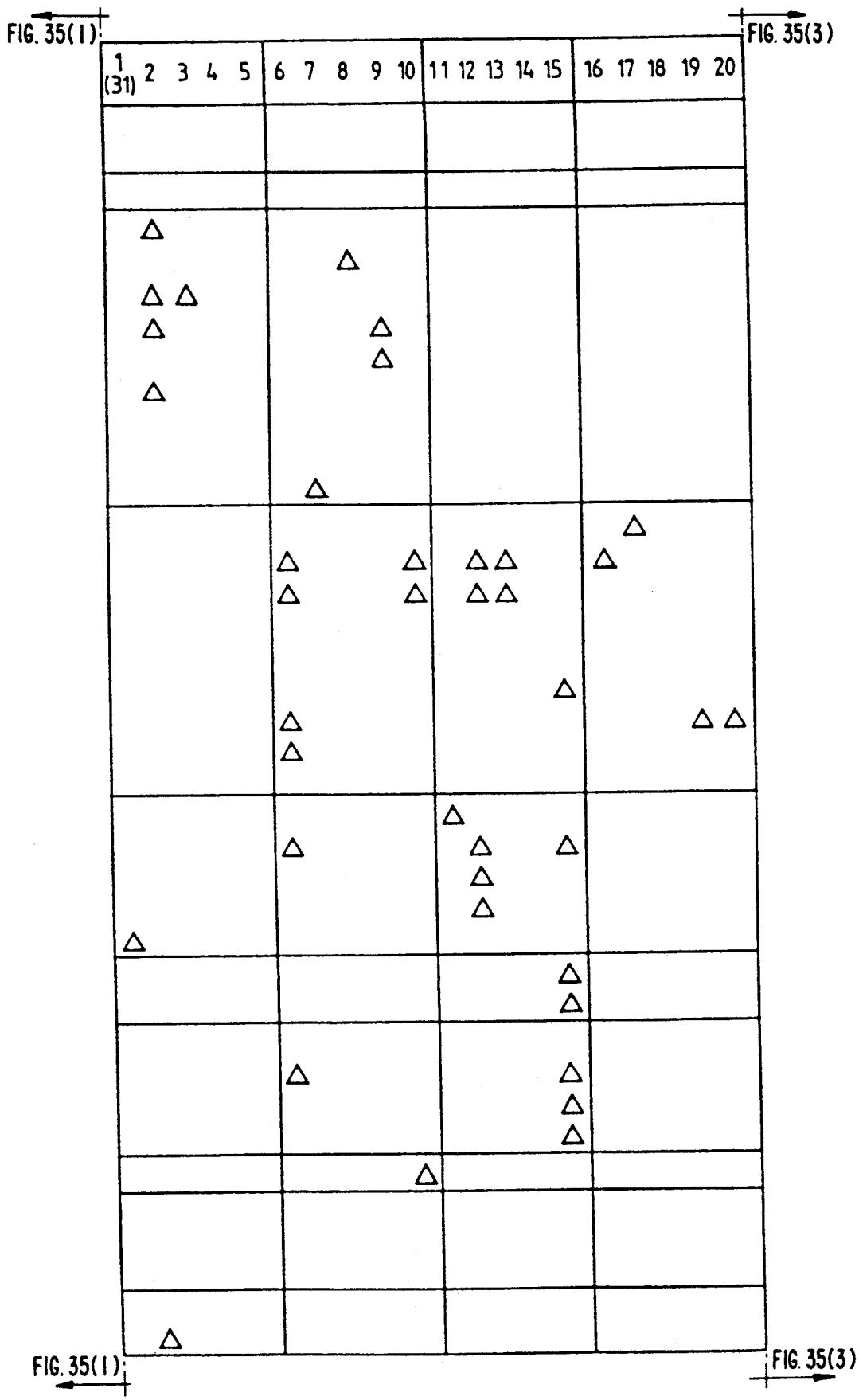

FIG. 32 is a block diagram of one example of a dynamic type RAM to which the present invention is applied. FIGS. 1 to 30 are circuit diagrams each showing one example of one of the various blocks of the dynamic type RAM shown in FIG. 32. In addition, FIGS. 34 to 36 are tables showing signals formed in the various blocks of the dynamic type RAM and where the signals are supplied. Circuit elements constituting each block shown in FIG. 32 and each of the circuit elements shown in FIGS. 1 to 30 are, although not necessarily limitative, formed on a single semiconductor substrate such as a single crystal silicon by a known semiconductor integrated circuit manufacturing technique. The arrangement and operation of the dynamic type RAM according to this example will be described hereinunder with reference to the block diagram of FIG. 32 and the circuit diagrams of FIGS. 1 to 30. It is requested that the signal tables shown in FIGS. 34 to 36 be referred to as occasion demands in the process of description of the example. It should be noted that a clocked inverter and a delay circuit DLY which are shown in the circuit diagrams are specifically arranged as shown in FIG. 4, although not necessarily limitative thereto. In the figures, a MOSFET which has an arrow added to its channel (back gate) section is a P-channel MOSFET, whereas a MOSFET having no arrow is an N-channel MOSFET. In the signal tables shown in FIGS. 34 to 36, Δ denotes a figure which shows the block to which a particular signal is supplied.

In the dynamic type RAM according to this example, two different kinds of photomask which are prepared in advance are selectively used to select units in which storage data is input and output, that is, a bit pattern, so as to be either ×1 bit pattern or ×4 bit pattern, although not necessarily limitative thereto. These two photomasks have respective arrangements which are partially differnet from each other at connection switching points denoted by CS1 to CS7 in the circuit diagrams, in which the arrangement for the ×1 bit pattern is shown by the solid lines, while the arrangement for the ×4 bit pattern is shown by the chain lines.

On the other hand, the dynamic type RAM of this example is, although not necessarily limitative, provided with two operating mode setting pads FP0 and FP1. These pads are selectively bonded to the circuit ground potential or the power supply voltage Vcc in a predetermined combination, whereby a plurality of operating modes are selectively designated. In this example, when the dynamic type RAM is adapted for the ×1 bit pattern, the following four different kinds of operating mode are prepared, that is first page mode, static column mode, nibble mode, and serial mode, although not necessarily limitative thereto. When the dynamic type RAM is adapted for the ×4 bit pattern, the following four different kinds of operating mode are prepared, that is, the above-described first page mode, static column mode and serial mode, and mask write mode. Each circuit of the dynamic type RAM is supplied with internal control signals SC, NE, SR and MS for setting an operating mode from a common section COM of a timing generating circuit TG, the internal control signals being combined with each other in correspondence with the designated operating mode. More specifically, the internal control signals SC, NE, SR and MS are formed in a predetermined combination by selectively bonding the operating mode setting pads FP0, FP1 and the circuit ground potential or the power supply voltage Vcc.

Referring to FIG. 32, the dynamic type RAM of this example is, although not necessarily limitative, provided with two column address decoders CDCR0 and CDCR1, and two pairs of memory arrays MARY0, MARY1 and MARY2, MARY3 are provided such as to sandwich the respective column address decoders CDCR0 and CDCR1.

Figure 25:
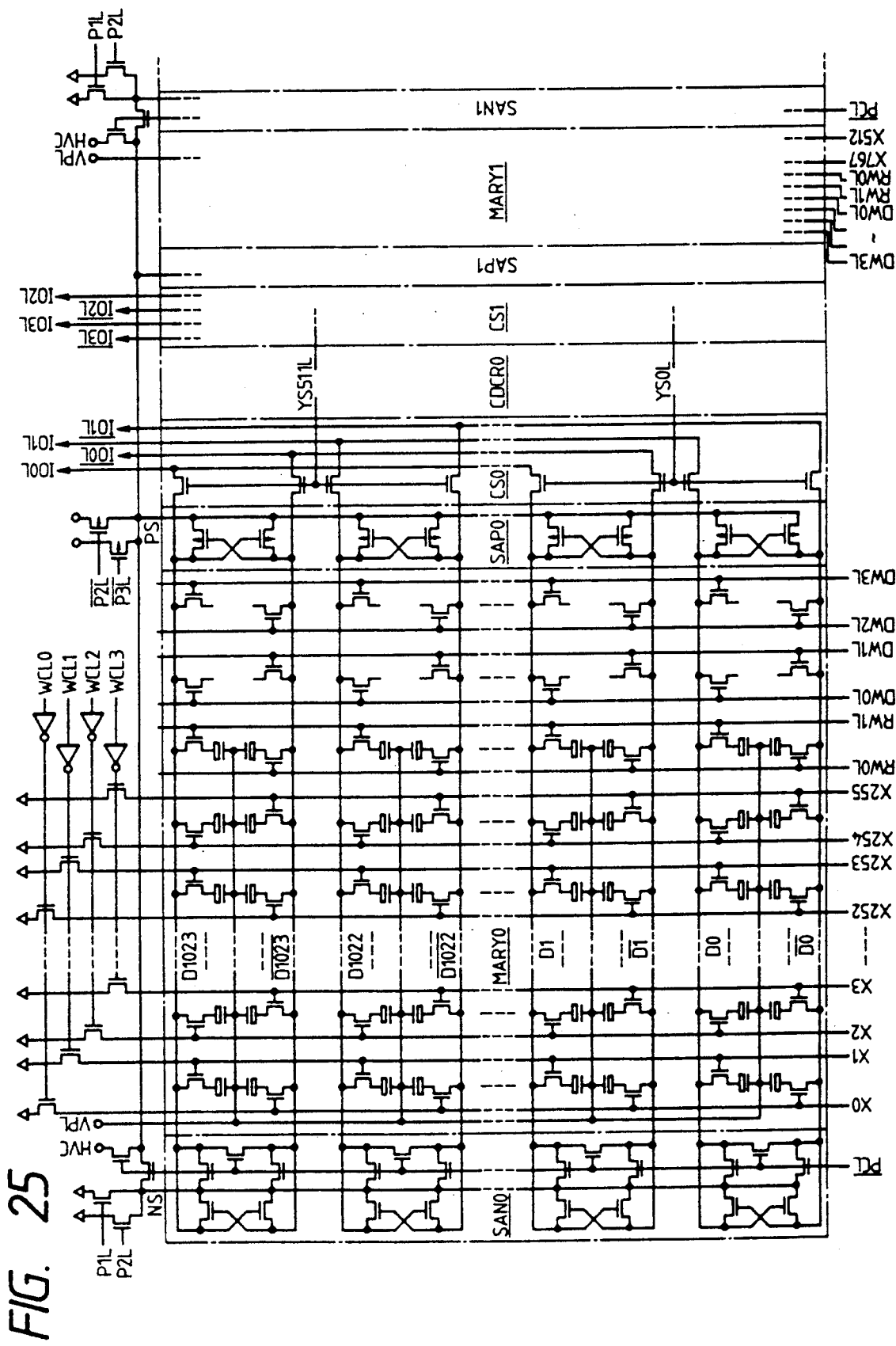
FIG. 25 is a circuit diagram showing one example of a memory array and its peripheral circuits in a dynamic type RAM to which the present invention is applied.

As shown in FIG. 25, the memory array MARY0 has, although not necessarily limitative, a folded-bit cell arrangement and includes 256 word lines X0 to X255, two redundant word lines RW0L, RW1L and four dummy word lines DW0L to DW3L, which are disposed so as to extend vertically as viewed in the figure. The memory array MARY0 further includes, although not necessarily limitative, 1024 pairs of complementary data lines D0, $\overline{D0}$ to D1023, $\overline{D1023}$ and two pairs of redundant data lines (not shown), which are disposed so as to extend horizontally as viewed in the figure. Further, 258×1026 dynamic memory cells are respectively disposed at the intersections of the word lines and the redundant word lines on the one hand and the complementary data lines on the other in the shape of a matrix. In addition, 4×1026 dummy cells are respectively disposed at the intersections of the dummy word lines and the complementary data lines.

Each memory cell includes an information storage capacitor and an address selecting MOSFET which are connected in series, as exemplarily shown in FIG. 25. The other electrode of the information storage capacitor of each memory cell is mutually supplied with a predetermined cell plate voltage VPL. Each dummy cell includes only an address selecting MOSFET which is the same as that constituting each memory cell.

The memory array MARY1 is arranged in symmetry with respect to the above-described memory array MARY0. The other pair of memory arrays MARY2 and MARY3 are arranged in the same way as the above-described pair of memory arrays MARY0 and MARY1.

The word lines constituting the memory arrays MARY0 to MARY3 are connected at one end thereof to the corresponding row address decoders RDCR0 to RDCR3. Among these word lines, 256 word lines and two redundant word lines are alternatively brought into a select state according to a given row address. Four dummy word lines are brought into a select state simultaneously with the corresponding word lines or redundant word lines according to the low-order 2 bits of a given row address. The word lines X0 to X255 are, although not necessarily limitative, connected to the other end thereof to the circuit ground potential through the corresponding N-channel MOSFETs. The gates of these MOSFETs are supplied with the corresponding word line clear signals WCL0 to WCL3, respectively. Thus, when the dynamic type RAM is in a non-select state, the levels of the word lines X0 to X255 are fixed to the circuit ground potential, whereas, when the RAM is brought into a select state, the levels of the word lines X0 to X255 are selectively released from the fixed state and alternatively brought to a select state which is defined by a high level.

As shown in FIG. 32, the row select circuit of the dynamic type RAM is, although not necessarily limitative, arranged in a two-stage structure which includes a pre-row address decoder PRDCR and row address decoders RDCR0 to RDCR3.

Figure 12:
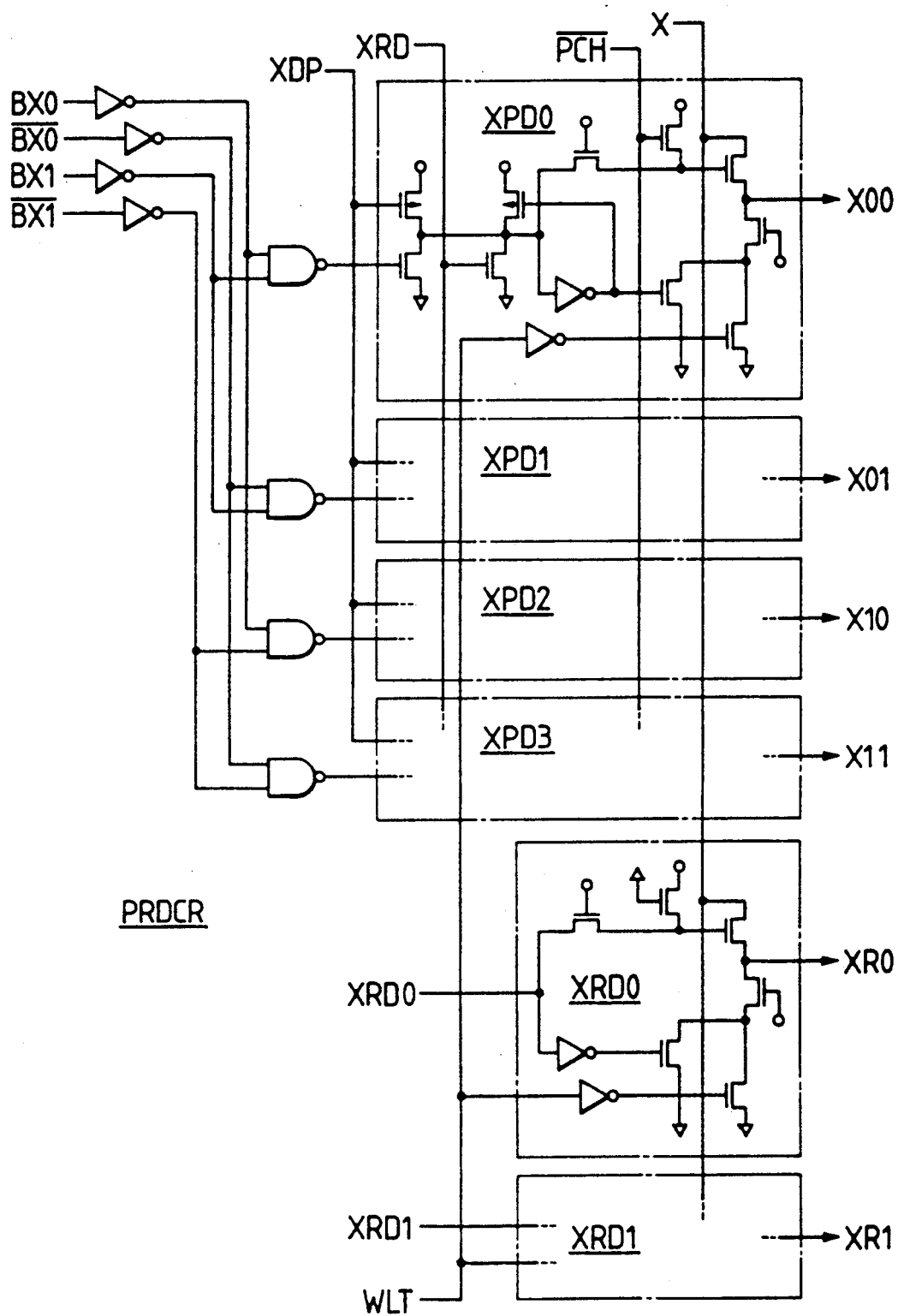
Figure 13:
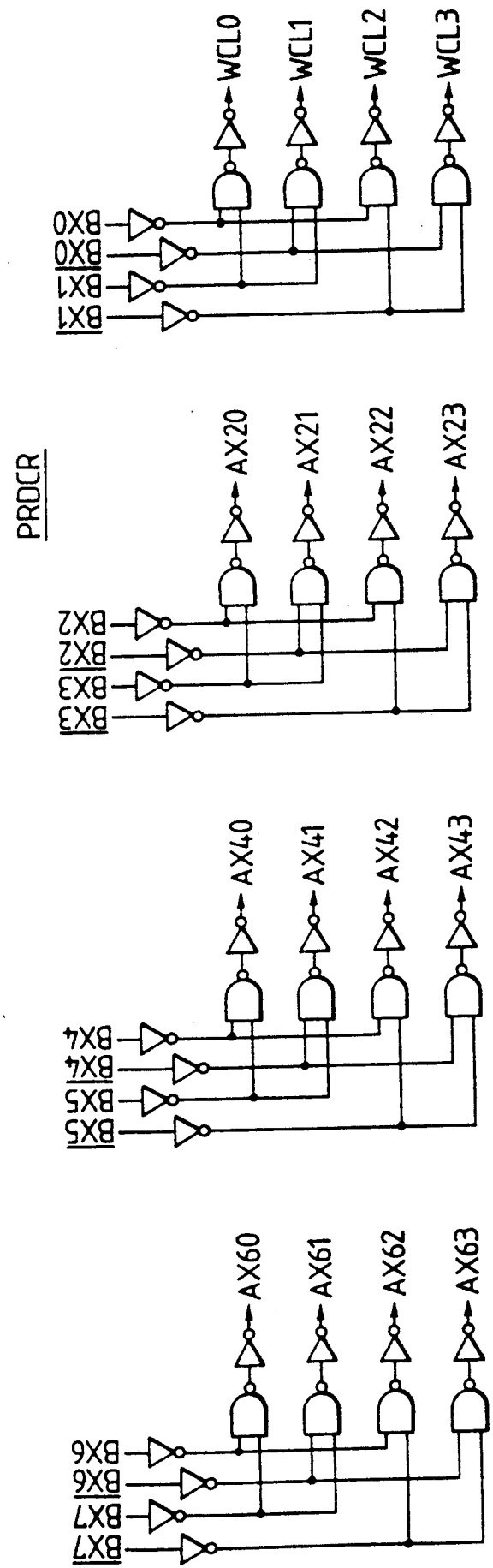
Figure 14:
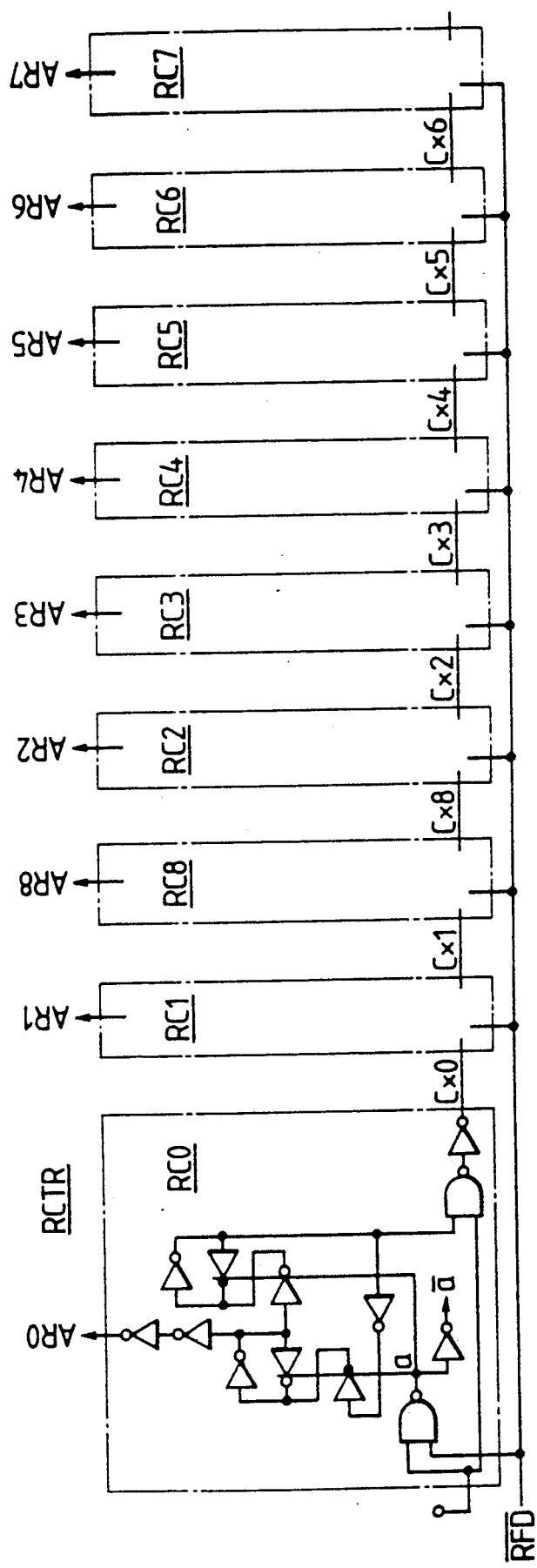
FIG. 14 is a circuit diagram showing one example of a refresh address counter of a dynamic type RAM to which the present invention is applied.

As shown in FIGS. 12 and 13, the pre-row address decoder PRDCR is supplied with complementary internal address signals $\overline{BX0}$ to $\overline{BX7}$ (herein, for example, a combination of a non-inverted internal address signal BX0 and an inverted internal address signal $\overline{BX0}$ is represented by a complementary internal address signal $\overline{BX0}$; the same rule applies to the following description) and decodes these address signals for each pair of bits to form word line select timing signals X00–X11 and pre-decode dignals WCL0–WCL3 and AX20–AX23 to AX60–AX63.

Figure 11:
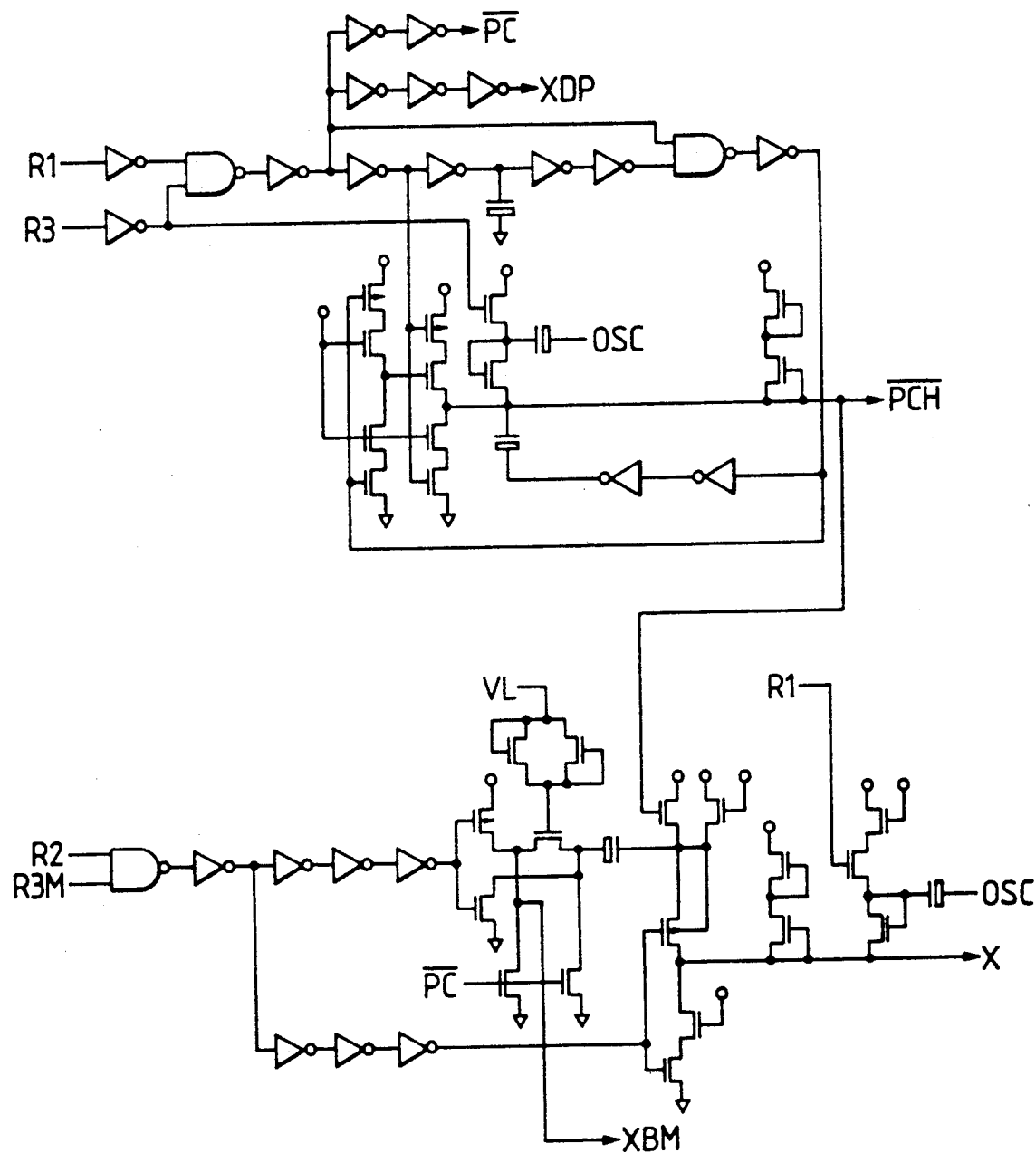
FIGS. 11 to 13 are circuit diagrams showing one example of a pre-row address decoder of a dynamic type RAM to which the present invention is applied.

The pre-row address decoder PRDCR further includes two boost circuits such as those shown in FIG. 11, although not necessarily limitative thereto. These boost circuits form boost signals $\overline{PCH}$ and X, respectively, which have a higher voltage than the power supply voltage Vcc. A level assuring circuit which is supplied with an oscillation signal OSC is added to each of these boost circuits. The pre-row address decoder PRDCR further includes redundant word line select circuits XRD0 and XRD1 which selectively form redundant word line select timing signals XR0 and XR1 by combining together the boost signal X and internal signals XRD0 and XRD1 supplied from a redundant address select circuit RAC.

Figure 15:
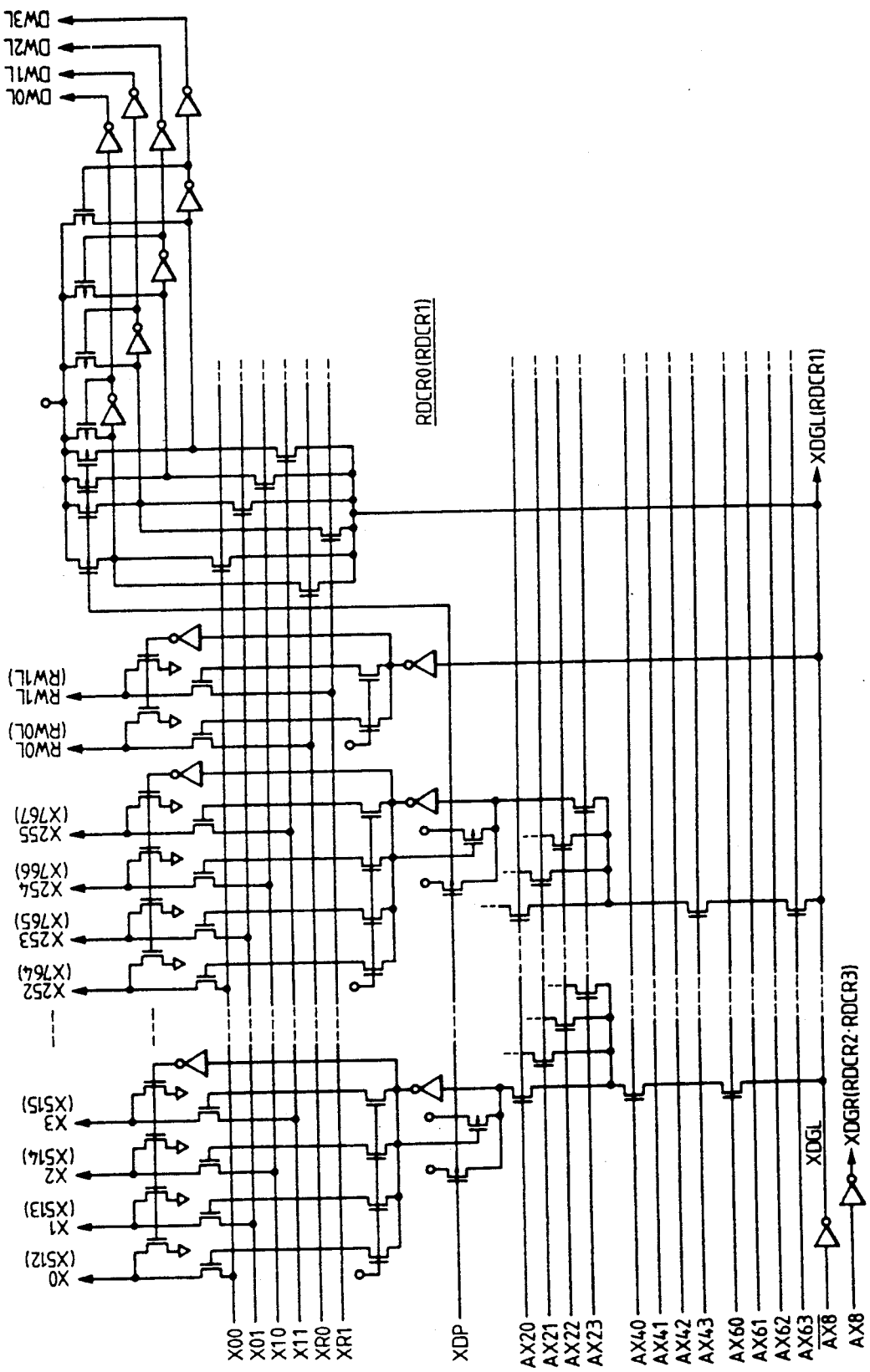
FIG. 15 is a circuit diagram showing one example of a row address decoder of a dynamic type RAM to which the present invention is applied.

On the other hand, the row address decoders RDCR0 to RDCR3 are arranged as shown in FIG. 15 which is a circuit diagram showing the row address decoder RDCR0 as a representative. More specifically, each row address decoder includes a dynamic type 3-stage decoder three and a word line driver circuit provided in correspondence with four word lines of the memory array MARY0. Each of the row address decoders RDCR0 to RDCR3 combines together the word line select timing signals X00 to X11, the redundant word line select timing signals XR0, XR1 and the predecode signals AX20–AX23 to AX60–AX63, which are supplied from the pre-row address decoder PRDCR, to alternatively bring one of the corresponding word lines X0 to X1023 or the corresponding redundant word lines RW0L (RW0R) and RW1L (RW1R) to a select state which is defined by a high level. At the same time, the one of the dummy word lines DW0L (DW0R) to DW3L (DW3R) which corresponds to the selected word line or redundant word line is brought to a select state which is defined by a low level according to the word line select timing signals X00 to X11.

Figure 10:
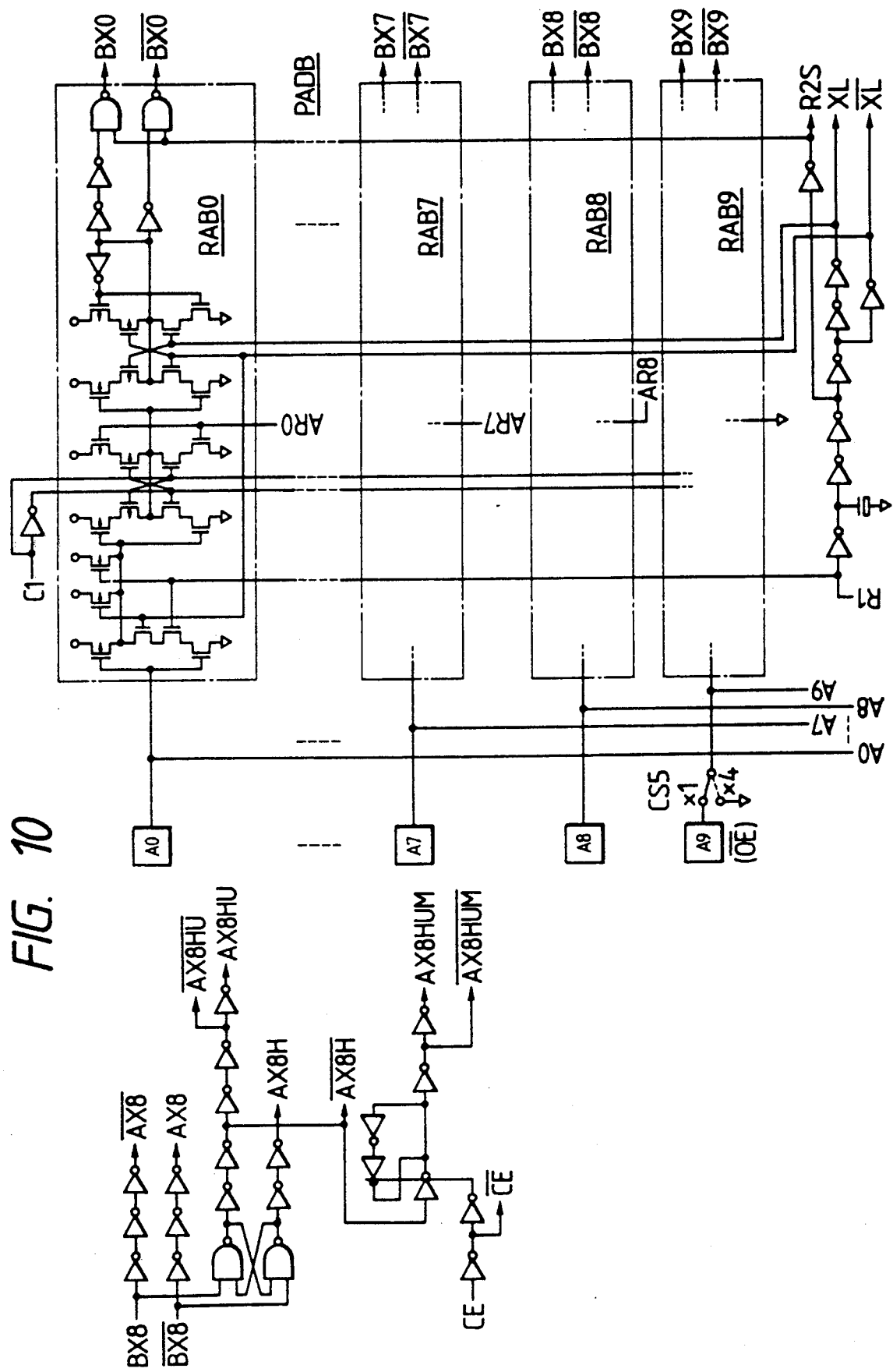
FIG. 10 is a circuit diagram showing one example of a row address buffer of a dynamic type RAM to which the present invention is applied.

As shown in FIG. 10, the row address buffer RADB includes 10 unit address buffers RAB0 to RAB9 which are provided in correspondence with external terminals A0 to A9. As representatively shown in FIG. 10 by the unit address buffer RAB0, each unit address buffer includes an input gate circuit, an address multiplexer and an address latch, which are provided in correspondence with one external terminal (A0). The other input terminals of the address multiplexers are supplied with the corresponding refresh address signals AR0 to AR8, respectively, from a refresh address counter RCTR. The address multiplexer of the unit address buffer RAB9 for the most significant bit has no particular significance. When the dynamic type RAM is adapted for the ×1 bit pattern, the input terminal of the unit address buffer RAB9 is connected to the external terminal A9 through the connection switching point CS5 and thus selectively validated. When the dynamic type RAM is adapted for the ×4 bit pattern, the external terminal A9 serves as an external terminal $\overline{OE}$ for inputting an output enable signal $\overline{OE}$, although not necessarily limitative thereto.

The row address buffer RADB is supplied with an internal control signal R1 from a timing generating circuit TG (described later). The internal control signal R1 is formed on the basis of a row address strobe signal $\overline{RAS}$. The row address buffer RADB forms delay signals R2S, XL and $\overline{XL}$ by delaying the internal control signal R1. The address multiplexers of the row address buffer RADB are further supplied with an internal control signal C1 from the timing generating circuit TG as a select control signal. The internal control signal C1 is formed on the basis of a column address strobe signal $\overline{CAS}$. This is because the dynamic type RAM of this example is set in a refresh operation mode when the column address strobe signal $\overline{CAS}$ is changed to a low level in advance of the row address strobe signal $\overline{RAS}$.

The row address buffer RADB is supplied with row address signals in accordance with the internal control signal R1, the row address signals being supplied in a time division manner through the external terminals A0 to A9. The input row address signals are taken in and held in the respective address latches in accordance with the delay signals XL and $\overline{XL}$. When the internal control signal C1 is set to the logic "1" before the internal control signals XL and $\overline{XL}$ are set to the logic "1", the dynamic type RAM is set in the refresh mode. At this time, the row address buffer RADB takes in and holds the refresh address signals AR0 to AR7. In response to the shift of the delay signal R2S to a high level, these address latch output signals are output in the form of the complementary internal address signals BX0 to $\overline{BX}$9 which are supplied to the pre-raw address decoder PRDCR and the redundant address select circuit RAC. The complementary internal address signal $\overline{BX}$9 for the most significant bit is also supplied to the nybble counter NCTR (described later).

On the other hand, the complementary data lines constituting the memory arrays MARY0 to MARY3 are, as shown in FIG. 25, connected at one end thereof to respective unit circuits in the corresponding N-type sense amplifiers SAN0 to SAN3.

As exemplarily shown in FIG. 25, each of the unit circuits constituting the N-type sense amplifiers SAN0 to SAN3 includes an amplifier circuit having two cross-coupled N-channel MOSFETs and a unit precharge circuit having three N-channel MOSFETs provided between a non-inverted signal line and an inverted signal line which constitute a complementary data line pair, although not necessarily limitative thereto. Each amplifier circuit in the N-type sense amplifiers SAN0 to SAN3 is, although not necessarily limitative, supplied with the circuit ground potential through a common source line NS from N-channel driving MOSFETs which are supplied at their respective gates with the internal control signals P1L (P1R) and P2L (P2R). When the dynamic type RAM is in a non-select state and the inverted internal control signal $\overline{PCL}$ ($\overline{PCR}$) is raised to a high level, the common source line NS is set at a half precharge level HVC (i.e., a voltage which is substantially the middle between the power supply voltage Vcc and the circuit ground potential).

The complementary data lines constituting the memory arrays MARY0 to MARY3 are connected at the other end thereof to respective unit circuits in the corresponding P-type sense amplifiers SAP0 to SAP3 and further connected to respective switching MOSFET pairs in the corresponding column switches CS0 to CS3.

Each of the unit circuits constituting he P-type sense amplifiers SAP0 to SAP3 includes an amplifier circuit having two cross-coupled P-channel MOSFETs. These amplifier circuits cooperate with the corresponding amplifier circuits in the N-type sense amplifiers SAN0 to SAN3 to constitute CMOS latch circuits, respectively. The amplifier circuits constituting the P-type sense amplifiers SAP0 to SAP3 are, although not necessarily limitative, mutually supplied with the power supply voltage Vcc through a common source line PS from P-channel type driving MOSFETs which are supplied at the gates with the inverted internal control signals $\overline{P2L}$ ($\overline{P2R}$) and $\overline{P3L}$ ($\overline{P3R}$), respectively.

Thus, when the dynamic type RAM is in a non-select state and the inverted internal control signals $\overline{PCL}$ ($\overline{PCR}$) is raised to a high level, the non-inverted signal line and the inverted signal line which constitute each of the complementary data line pairs of the memory arrays MARY0 to MARY3 are shorted and thereby set at the half precharge level HVC. When the dynamic type RAM is in a select state and the inverted internal control signal $\overline{PCL}$ ($\overline{PCR}$) is changed to a low level, minute readout signals which are output from a plurality of memory cells coupled to the selected word line to the corresponding complementary data lines are amplified in the corresponding CMOS latch circuits to form binary (high or low level) readout signals.

As exemplarily shown in FIG. 25, each of the column switches CS0 to CS3 includes 1026 pairs of switching MOSFETs provided in correspondence with the complementary data lines of each of the memory arrays MARY0 to MARY3 The other ends of these switching MOSFETs are alternately mutually connected to the corresponding common input/output line pairs IO0L, IO1L, IO2L, IO3L, IO0R, IO1R and IO2R, IO3R. The gates of two pairs of adjacent switching MOSFETs in each memory array are mutually connected and supplied with the corresponding one of the data line select signals YS0L (YS0R) to YS511L (YS511R) from the corresponding column decoder CDCR0 or CDCR1. Two pairs of complementary data lines in each memory array are simultaneously selected when the corresponding one of the data line select signals YS0L (YS0R) to YS511L (YS511R) is alternatively raised to a high level, and the selected two pairs of complementary data lines are selectively connected to the corresponding two pairs of common input/output lines.

The column select circuit of the dynamic type RAM in this example is arranged in a two-stage structure in the same way as the above-described row select circuit and includes a pre-column address decoder PCDCR and column address decoders CDCR0 and CDCR1.

Figure 19:
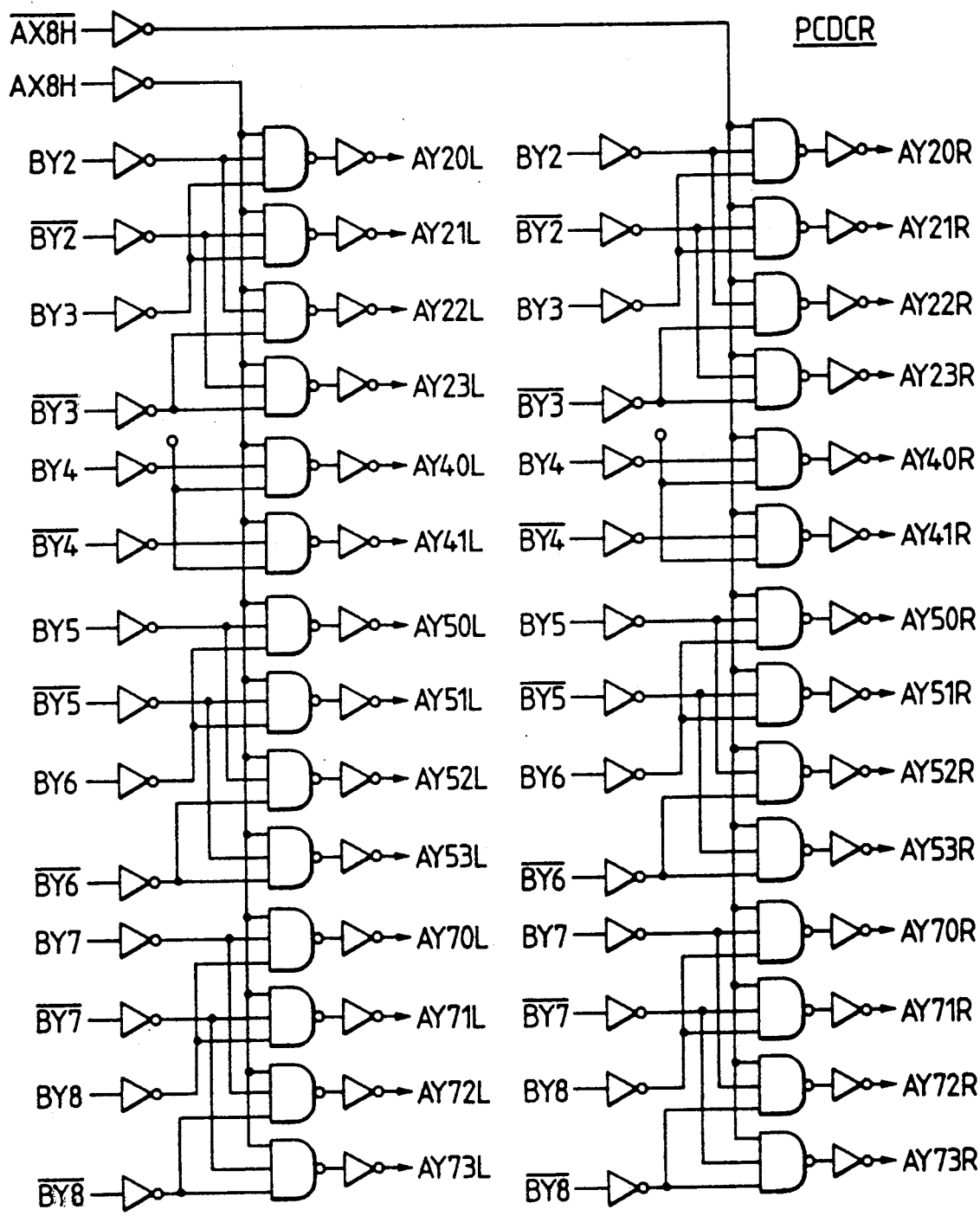
FIGS. 19 and 20 are circuit diagrams showing one example of a pre-column address decoder of a dynamic type RAM to which the present invention is applied.
Figure 20:
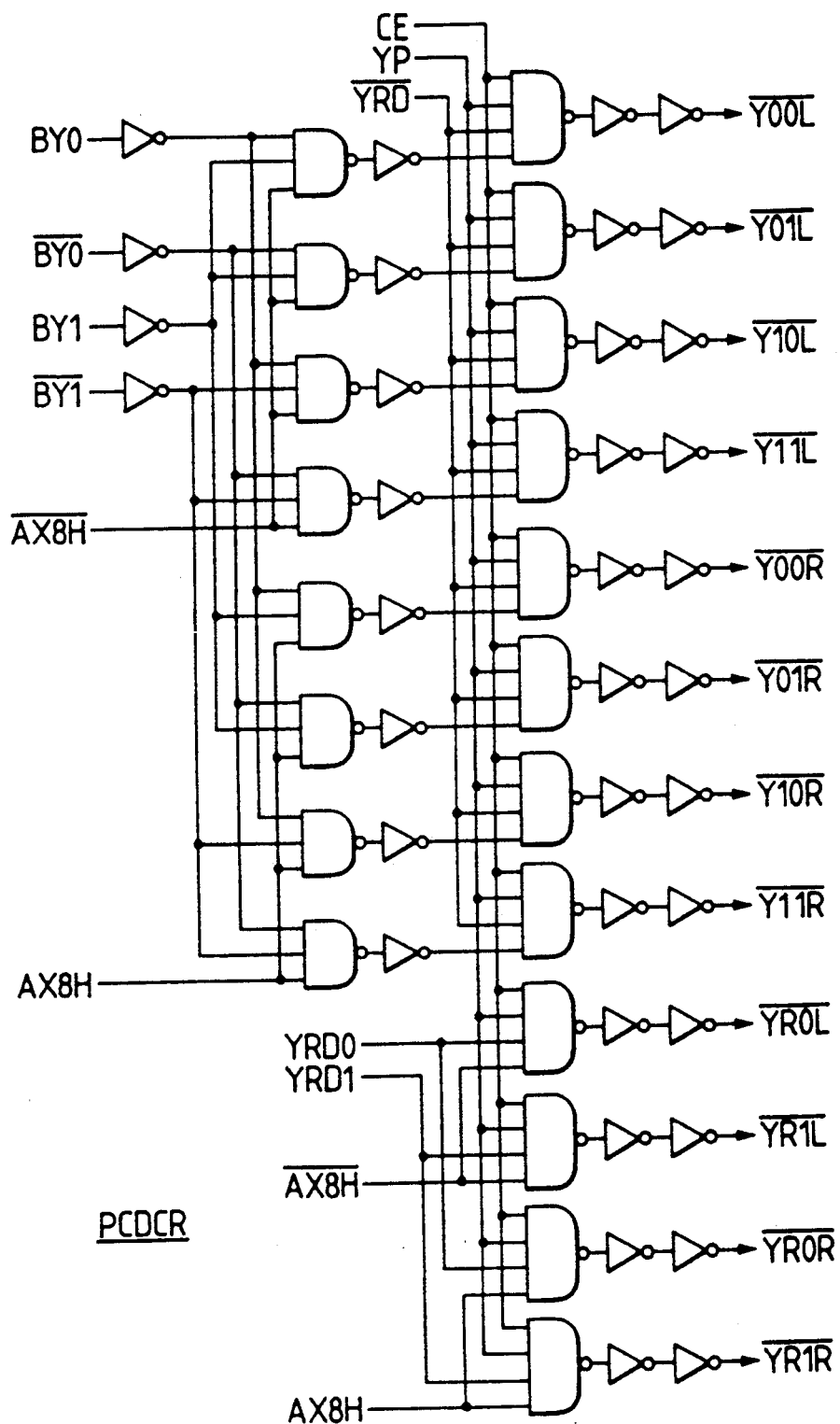

As shown in FIGS. 19 adn 20, the pre-column address decoder PCDCR is supplied with complementary internal address signals BY0 to BY8 from a column address buffer CADB. The pre-column address decoder PCDCR decodes these input address signals bitwise or for each combination of two bits and further combines them with the complementary select signals AX8H and $\overline{AX8H}$ supplied from the row address buffer RADB, thereby selectively forming inverted data line select timing signals $\overline{Y00L}$ ($\overline{Y00R}$) to $\overline{Y11L}$ ($\overline{Y11R}$) and pre-decode signals AY20L (AY20R)–AY23L (AY23R) to AY70L (AY70R)–AY73L (AY73R). Further, the pre-row address decoder PRDCR combines together the above-described complementary select signals AX8H, $\overline{AX8H}$ and internal signals YRD0, YRD1 which are supplied from a redundant address select circuit RAC to selectively form inverted redundant data line select timing signals $\overline{YR0L}$ ($\overline{YR0R}$) and $\overline{YR1L}$ ($\overline{YR1R}$).

Figure 22:
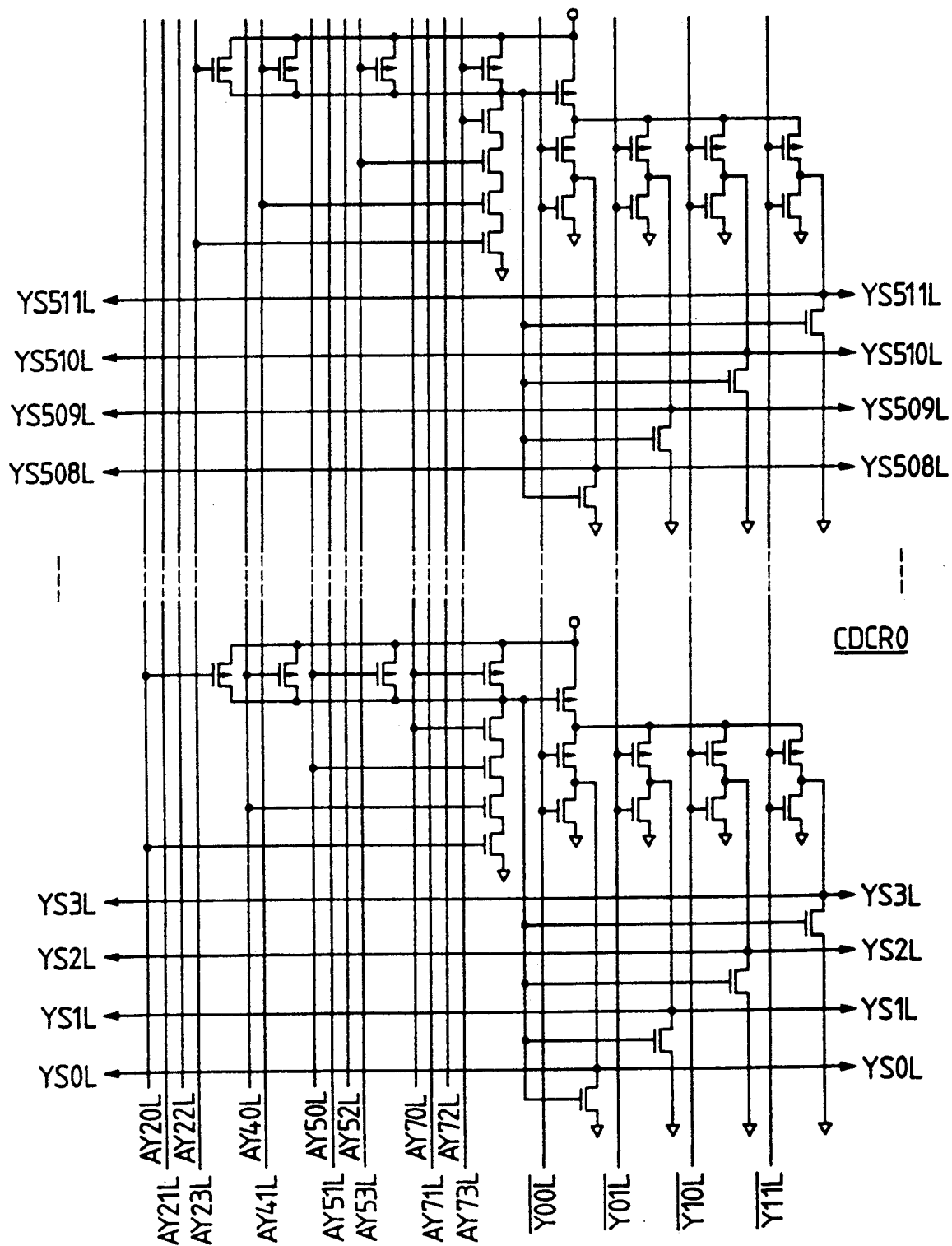
FIG. 22 is a circuit diagram showing one example of a column address buffer of a dynamic type RAM to which the present invention is applied.

On the other hand, each of the column address decoders CDCR0 and CDCR1 includes, as exemplarily shown in FIG. 22 by the column address decoder CDCR0, 128 unit circuits each comprising a 4-input AND gate circuit and four CMOS inverter circuits which are selectively validated in accordance with the output signal from the AND gate circuit. The AND gate circuit of each unit circuit is supplied with the pre-decode signals AY20L (AY20R)–AY23L (AY23R) to AY70L (AY70R)–AY73L (AY73R) in a predetermined combination. The four CMOS inverter circuits of each unit circuit are sequentially supplied with the inverted data line select timing signals $\overline{Y00L}$ ($\overline{Y00R}$) to $\overline{Y11L}$ ($\overline{Y11R}$).

The column address decoders CDCR0 and CDCR1 combine together the inverted data line select timing signals, inverted redundant data line select timing signals and pre-decode signals supplied from the pre-column address decoder PCDCR, thereby selectively forming the data line select signals YS0L (YS0R) to YS511L (YS511R) and the like for selecting the corresponding two pairs of complementary data lines or redundant data lines.

Figure 17:
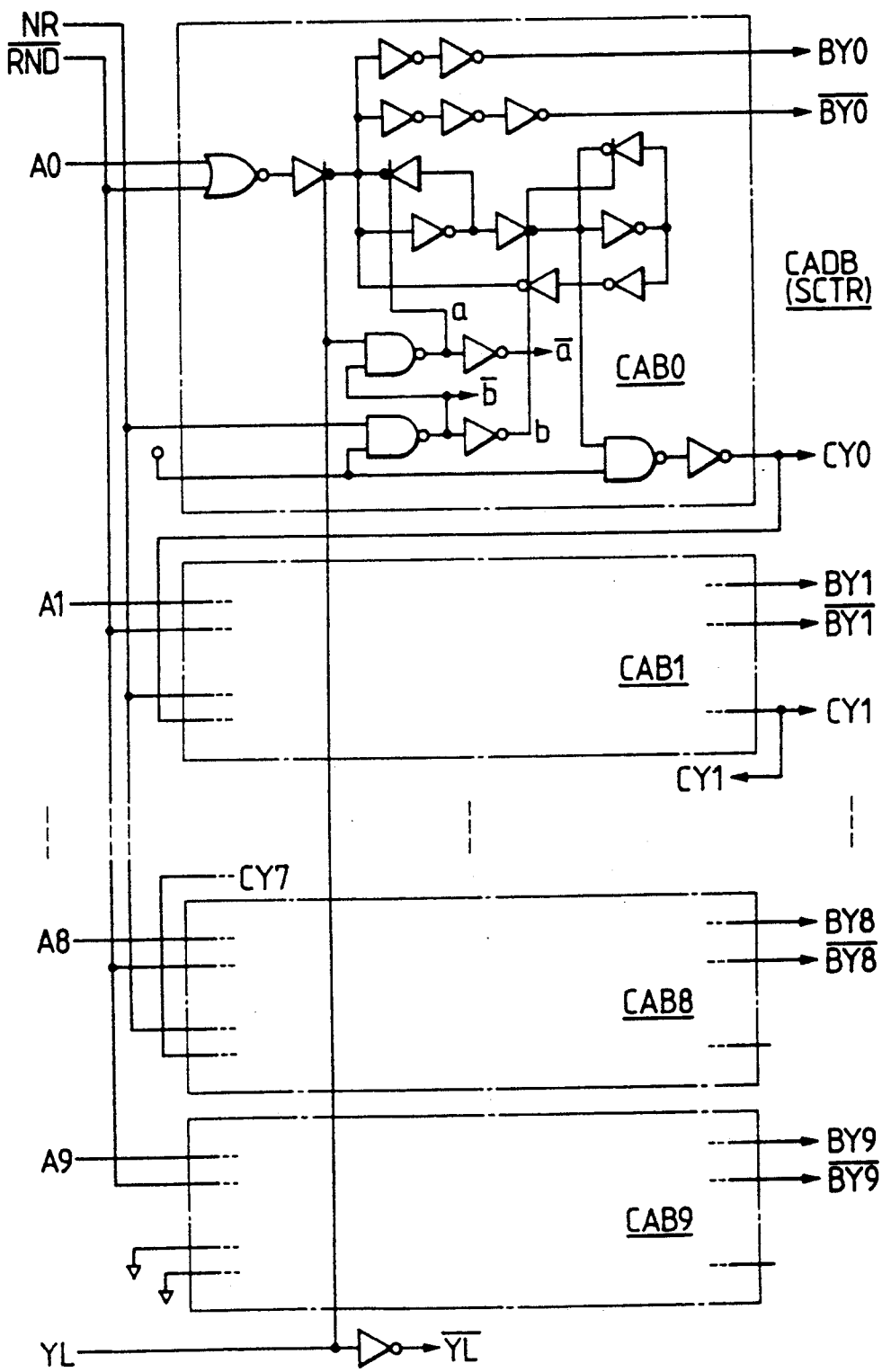
FIG. 17 is a circuit diagram showing one example of a column address buffer and serial counter of a dynamic type RAM to which the present invention is applied.

As shown in FIG. 17, the column address buffer CADB includes 10 input gate circuits and 10 address latches, which are provided in correspondence with the external terminals A0 to A9. When the dynamic type RAM is set in the serial mode, these address latches constitute a serial counter SCTR, together with 10 slave latches provided in correspondence with the address latches. The input gate circuits of the column address buffer CADB are supplied with an inverted internal control signal $\overline{\text{RND}}$ from the timing generating circuit TG. The inverted internal control signal $\overline{\text{RND}}$ is formed by latching and thereby delaying the above-described internal control signal R1. The address latches of the column address buffer CADB are supplied with an internal control signal YL from the timing generating circuit TG. The internal control signal YL is formed in accordance with the column address strobe signal $\overline{\text{CAS}}$. When the address latches of the column address buffer CADB function as a serial counter SCTR, each bit of the serial counter SCTR is supplied with an internal control signal NR. The internal control signal NR is, although not necessarily limitative, periodically formed in synchronism with the fall edge of the column address strobe signal $\overline{\text{CAS}}$ when the dynamic type RAM is in the serial mode. In the case where the dynamic type RAM is adapted for the ×1 bit pattern, the internal control signal NR is formed in accordance with a carry signal which is output from the nibble counter NCTR. Thus, the serial counter SCTR is connected in series to the nibble counter NCTR to form a divide-by-2048 counter.

The column address buffer CADB is supplied with column address signals in accordance with the inverted internal control signal $\overline{\text{RND}}$, the row address signals being supplied in a time division manner through the external terminals A0 to A9. The input column address signals are taken in and held in the respective address latches in accordance with the internal control signals YL. The output signals from these address latches are supplied in the form of the complementary internal address signals BY0 to BY9 to the pre-column address decoder PCDCR, the redundant address select circuit RAC and the address signal change detecting circuit ATD. The complementary internal address signal BY9 for the most significant bit is also supplied to the nibble counter NCTR.

Figure 23:
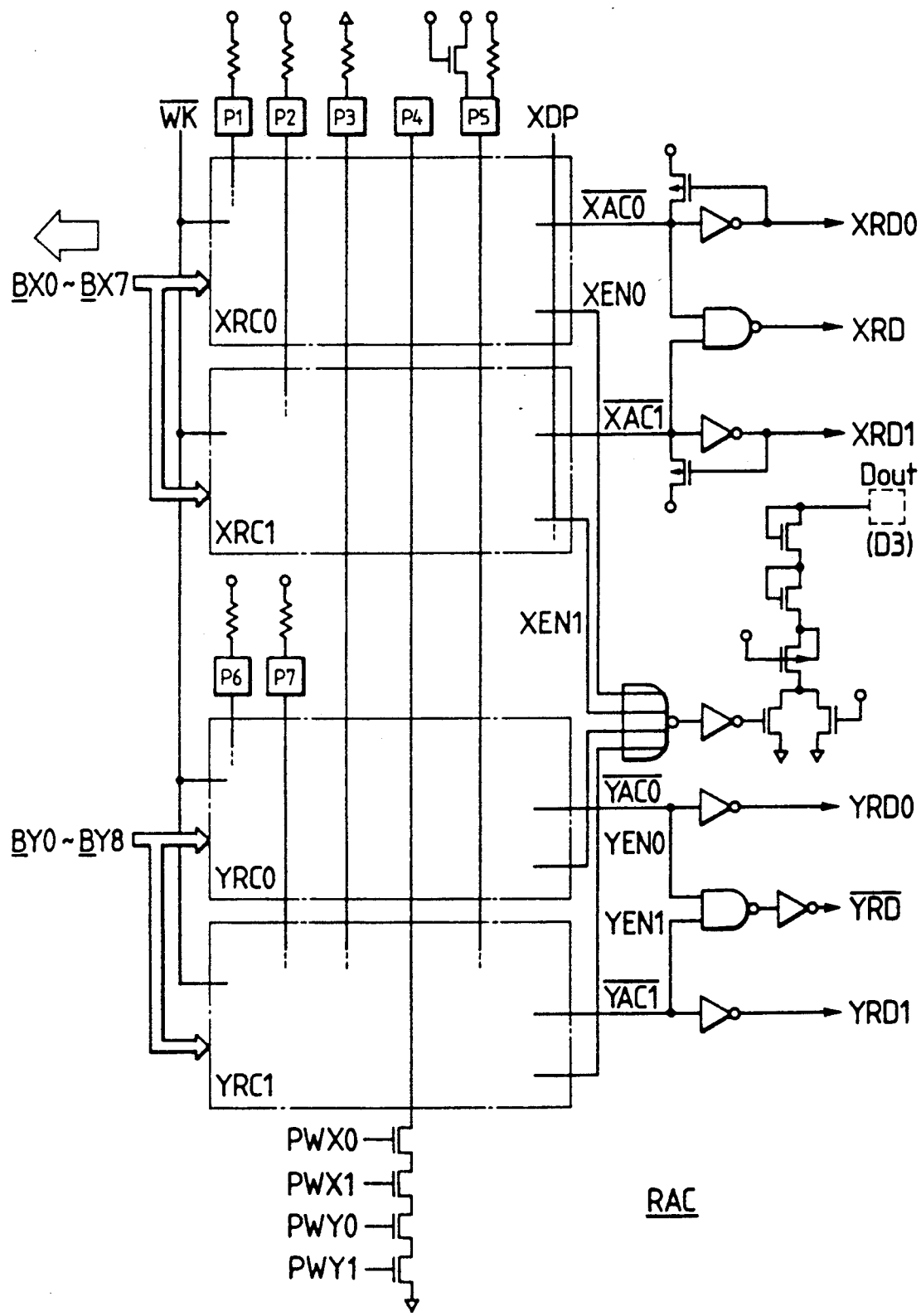
FIGS. 23 and 24 are circuit diagrams showing one example of a redundant address control circuit of a dynamic type RAM to which the present invention is applied.

As shown in FIG. 23, the redundant address control circuit RAC includes two redundant word line select circuits XRC0 and XRC1 provided in correspondence with the redundant word lines in the memory arrays MARY0 to MARY3 and two redundant data line select circuits YRC0 and YRC1 provided in correspondence with the redundant data lines, although not necessarily limitative.

Figure 24:
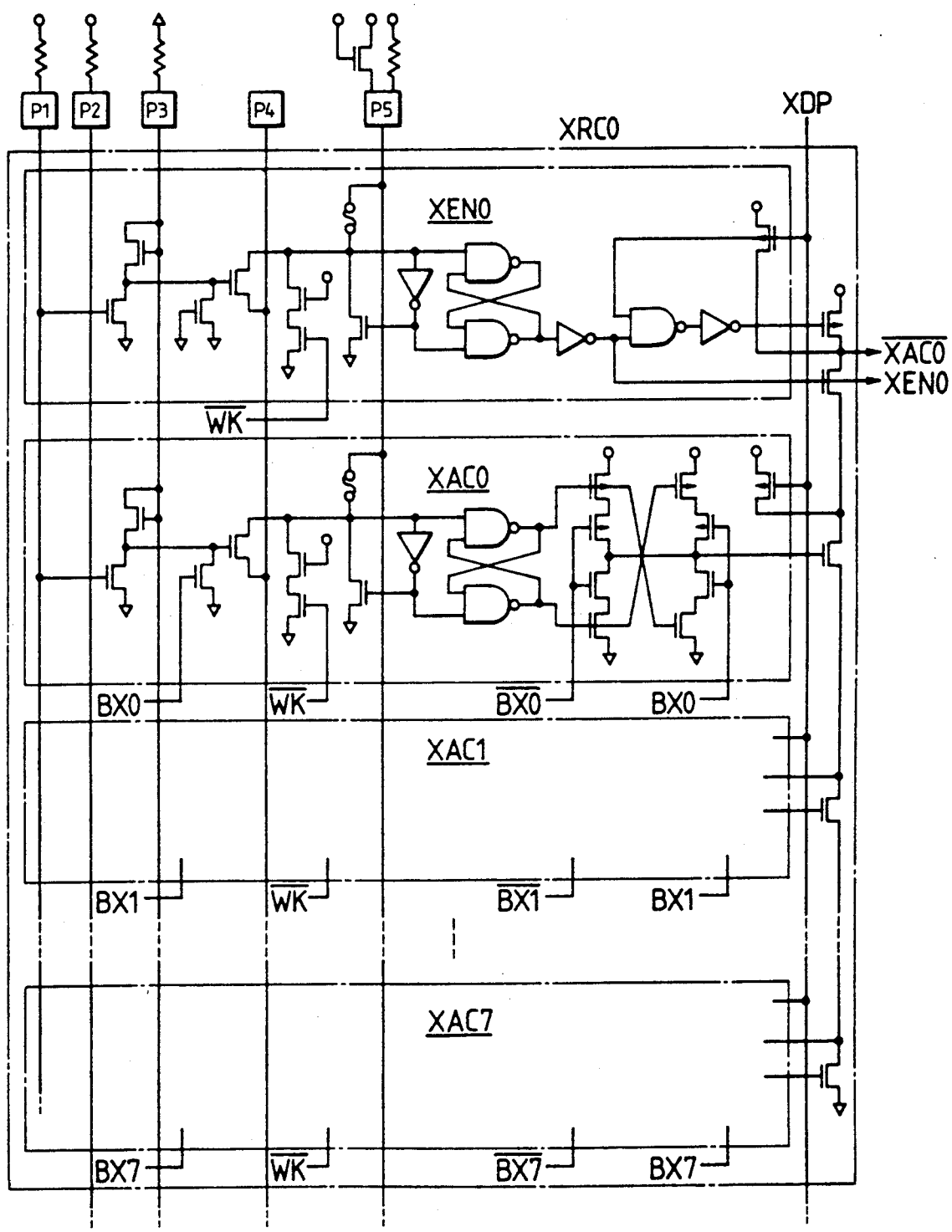

As representatively shown in FIG. 24 by the redundant word line select circuit XRC0, each of the redundant word and data line select circuits XRC0, XRC1 and YRC0, YRC1 includes one redundant enable circuit XEN0 (XEN1, YEN0 or YEN1) and eight or nine redundant address comparing circuits XAC0 to XAC7 (or YAC0 to YAC8). Each of the redundant enable and redundant address comparing circuits includes a storage element comprising fuse means. Each redundant address comparing circuit further includes an address comparing circuit for making a bitwise comparison between a defective address held in the storage element and the corresponding one of the complementary internal address signals BX0 to BX7.

The output signals from the address comparing circuits are supplied to an NAND gate circuit comprising series connected N-channel MOSFETs to form each of the inverted address coincidence signals $\overline{\text{XAC0}}$, $\overline{\text{XAC1}}$ and $\overline{\text{YAC0}}$, $\overline{\text{YAC1}}$. Here, each of the redundant data line select circuits YRC0 and YRC1 is defined by a static type circuit, and the NAND gate thereof is constituted by an ordinary logic gate circuit. The inverted address coincidence signals $\overline{\text{XAC0}}$, $\overline{\text{XAC1}}$ and $\overline{\text{YAC0}}$, $\overline{\text{YAC1}}$ are formed into internal select signals XRD0, XRD1 and YRD0, YRD1, respectively, and the former pair of signals are supplied to the pre-row address decoder PRDCR, while the latter pair of signals are supplied to the pre-column address decoder PCDCR. The NAND gate circuit that is provided in each select circuit is selectively brought into an operative state in accordance with the output signal from the corresponding redundant enable circuit.

Figure 18:
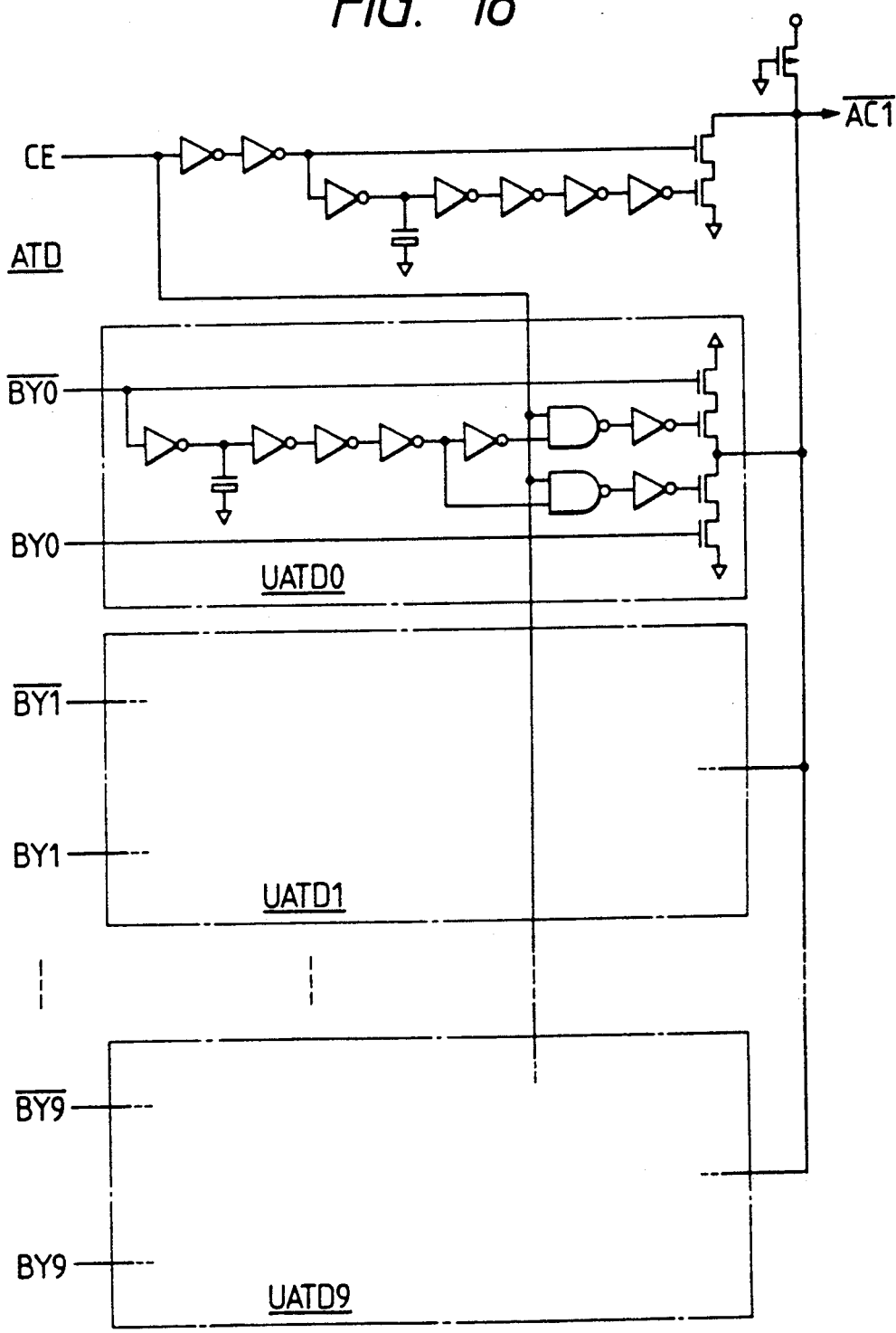
FIG. 18 is a circuit diagram showing one example of an address signal change detecting circuit of a dynamic type RAM to which the present invention is applied.

Referring to FIG. 18, the address signal change detecting circuit ATD includes one unit signal change detecting circuit provided in correspondence with the internal control signal CE and 10 unit signal change detecting circuits UATD0 to UATD9 which are provided in correspondence with the complementary internal address signals BY0 to BY9, respectively. Each unit signal change detecting circuit includes series connected N-channel MOSFETs which receive the internal control signal CE or the corresponding one of the complementary internal address signals BY0 to BY9 and its inverted delay signal. When the internal control signal CE changes from a low level to a high level, or when the level of any of the complementary internal address signals BY0 to BY9 is inverted while the internal select signal CE is at the high level, the output signal from the corresponding unit address signal change detecting circuit is changed to a low level and the inverted address signal change detecting signal $\overline{\text{ACI}}$ is changed to a low level. The inverted address signal change detecting signal $\overline{\text{ACI}}$ is supplied to the $\overline{\text{CAS}}$ timing generating section CTG of the timing generating circuit TG (described later) so as to be used as a trigger signal in the static column mode.

Figure 16:
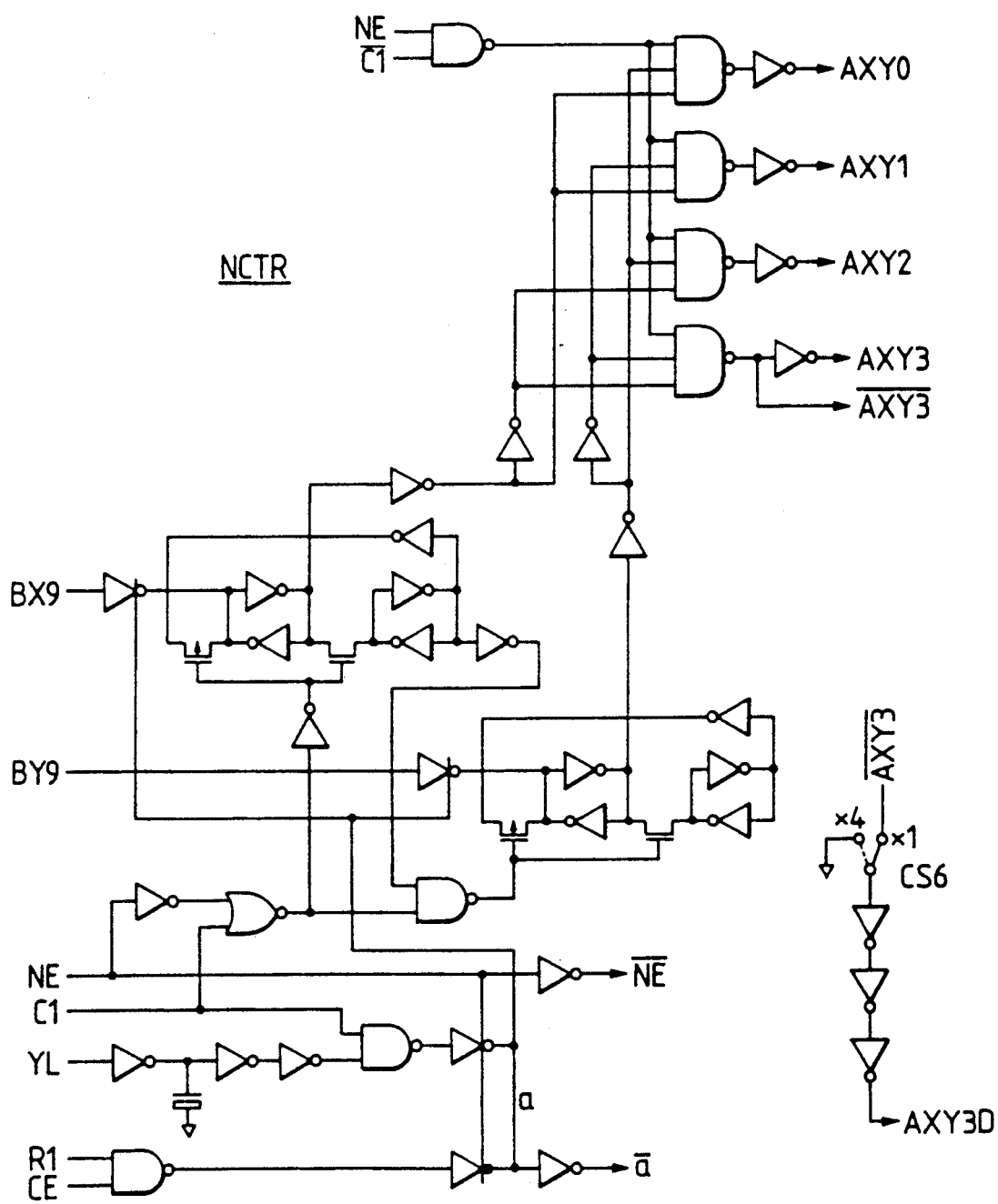
FIG. 16 is a circuit diagram showing one example of a nibble counter of a dynamic type RAM to which the present invention is applied.

As shown in FIG. 16, the nibble counter NCTR includes a 2-bit binary counter as a basic constituent element. The nibble counter NCTR operates as follows. When the dynamic type RAM is set in any operation mode other than the nibble mode and the serial mode, the internal select signal NE is changed to a low level, and the nibble counter NCTR takes in the most significant bit non-inverted internal address signals BX9 and BY9 in accordance with the internal control signal CE which is formed in synchronism with the fall edge of the row address strobe signal $\overline{\text{RAS}}$. When the dynamic type RAM is set in the nibble mode and the serial mode, the internal select signal NE is raised to a high level, and the nibble counter NCTR takes in the most significant bit non-inverted internal address signals BX9 and BY9 in accordance with an internal select signal C1 which is formed on the basis of the column address strobe signal $\overline{\text{CAS}}$. The nibble counter NCTR perform a counting operation in synchronism with the rise edge of the column address strobe signal $\overline{\text{CAS}}$, that is, the fall edge of the internal control signal C1. The output signal from the nibble counter NCTR is decoded to form internal select signals AXY0 to AXY3 which are then supplied to the main amplifiers MA0 to MA7 and testing logic circuit TL (described later) so as to be used as an input/output switching control signal when the dynamic type RAM is adapted for the ×1 bit pattern or it is set in the nibble mode.

The common input/output lines IO0L to IO3L and IO0R to IO3R are connected to the corresponding main amplifiers MA0 to MA7, respectively. The output terminals of each pair of main amplifiers are mutually connected and further connected to an input terminal of the corresponding one of the data output buffers DOB1 to DOB4 and also to the corresponding one of the input terminals of the testing logic circuit TL. The output terminal of the testing logic circuit TL is connected to the other input terminal of the data output buffer DOB3. The output terminals of the data output buffers DOB1 to DOB4 are connected to the corresponding external terminals D1 to D4, respectively. On the other hand, the input terminals of the corresponding data input buffers DIB1 to DIB4 are mutually connected to the external terminals D1 to D4, respectively. The output terminals of the data input buffers DIB1 to DIB4 are mutually connected to the input terminals of the corresponding pairs of main amplifiers MA0, MA4 to MA3, MA7.

In this example, when the dynamic type RAM is adapted for the ×1 bit pattern, the external terminal D2 is used as a data input terminal Din, while the external terminal D3 is used as a data output terminal Dout, although not necessarily limitative thereto. At this time, the output signals from the main amplifiers MA0 to MA7 are selectively transmitted to the data output buffer DOB3 through the testing logic circuit TL and delivered from the external terminal D3. Write data which is input through the external terminal D2 is mutally supplied to the respective input terminals of the main amplifiers MA0 to MA7 from the data input buffer DIB2 and selectively transmitted to the memory arrays MARY0 to MARY3 in accordance with internal select signals AX8HUM, $\overline{\text{AX8HUM}}$ supplied from the row address buffer RADB and the internal select signals AXY0 to AXY3 output from the nibble counter NCTR.

Figure 26:
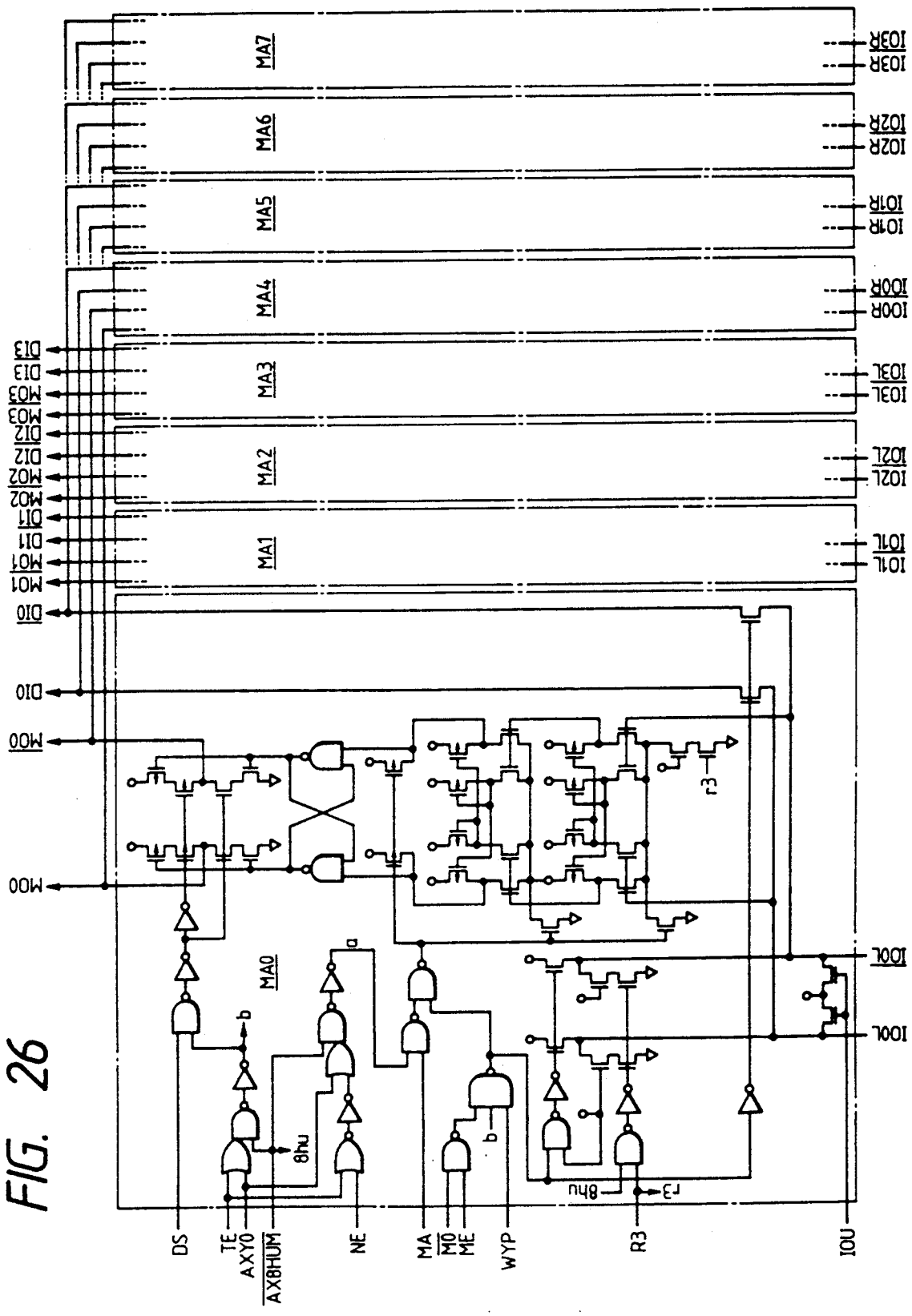
FIG. 26 is a circuit diagram showing one example of a main amplifier of a dynamic type RAM to which the present invention is applied.

Referring to FIG. 26 which shows the main amplifier MA0 as a representative, each of the main amplifiers MA0 to MA7 includes a main amplifier circuit which is selectively brought to an operative state in accordance with the internal control signal MA and a write circuit which is selectively brought to an operative state in accordance with an internal select signal WYP. The write circuit is selectively activated when the dynamic type RAM is set in the mask write mode and also in accordance with an internal select signal ME and inverted mask data $\overline{\text{M0}}$ to $\overline{\text{M3}}$.

Figure 27:
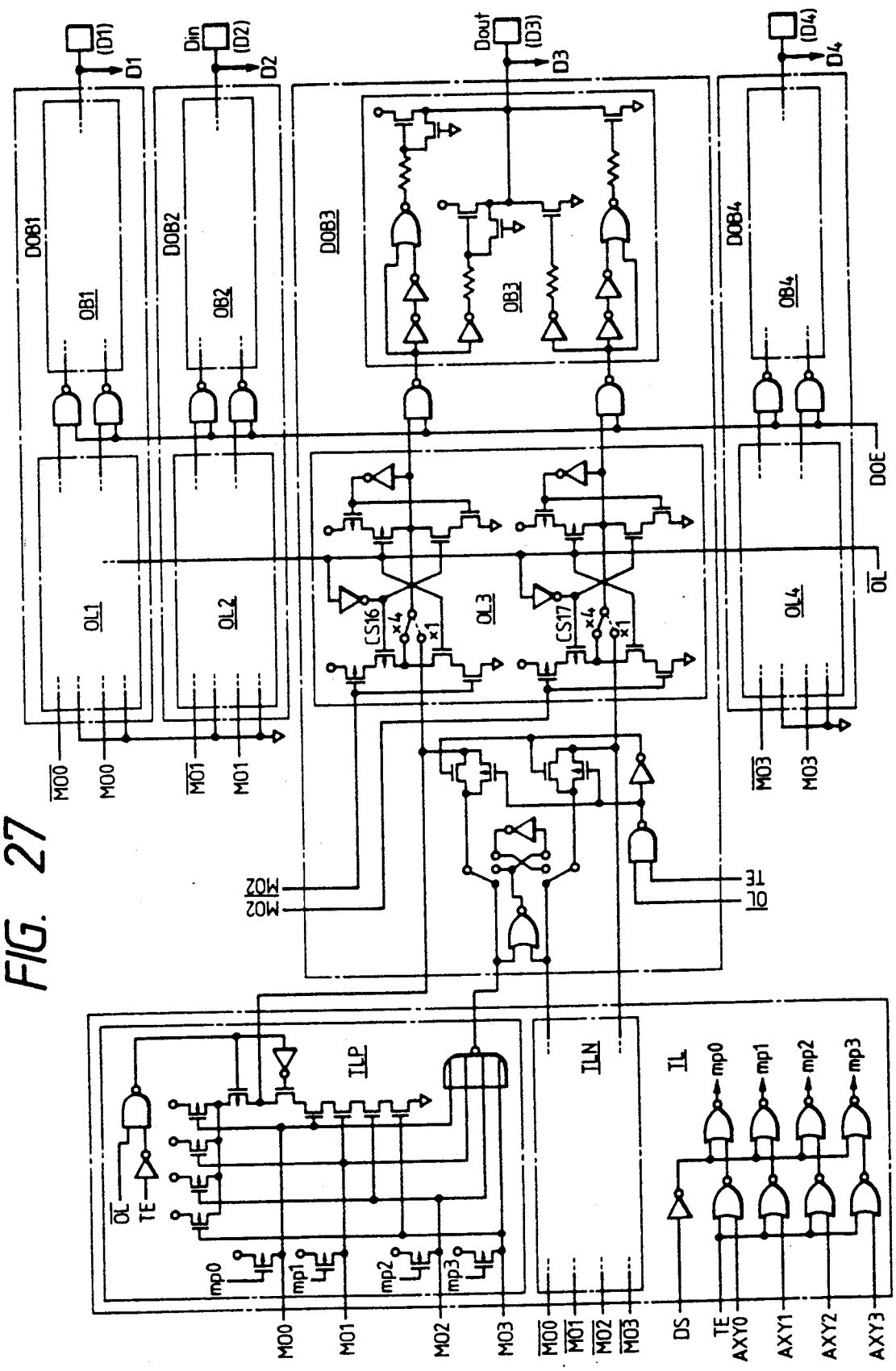
FIG. 27 is a circuit diagram showing one example of a testing logic circuit and data output buffer of a dynamic type RAM to which the present invention is applied.

As shown in FIG. 27, the testing logic circuit TL includes two unit testing logic circuits TLP and TLN which receive the non-inverted output signals MO0 to MO3 and inverted output signals $\overline{\text{MO0}}$ to $\overline{\text{MO3}}$ form each main amplifier. These unit testing logic circuits function as 4-input NAND gates circuits for the non-inverted output signals MO0 to MO3 and the inverted output signals $\overline{\text{MO0}}$ to $\overline{\text{MO3}}$, respectively, when the dynamic type RAM is set in the testing mode and the internal control signal TE is raised to a high level. Thus, the dynamic type RAM is capable of testing an operation of reading data in units of 4 bits. When the dynamic type RAM is set in any operation mode other than the testing mode, the main amplifiers MA0 to MA7 and the unit testing logic circuits TLP, TLN operate in such a manner that the output signals from the main amplifiers MA0 to MA7 are sequentially selected and transmitted to the data output buffer DOB3 in accordance with the data selecting internal control signal DS and the internal select signals AXY0 to AXY3.

As representatively shown in FIG. 27 by the data output buffer DOB3, the data output buffers DOB1 to DOB4 respectively include output latches OL1 to OL4 for holding the output signals from the corresponding pairs of main amplifiers MA0, MA4 to MA3, MA7 or the output signal from the testing logic circuit TL only during a write cycle and tri-state output buffers OB1 to OB4, although not necessarily limitative thereto. The output signals from the main amplifiers are delivered from the corresponding external terminals D1 to D4 or the data output terminal Dout in accordance with the internal control signal DOE.

Figure 21:
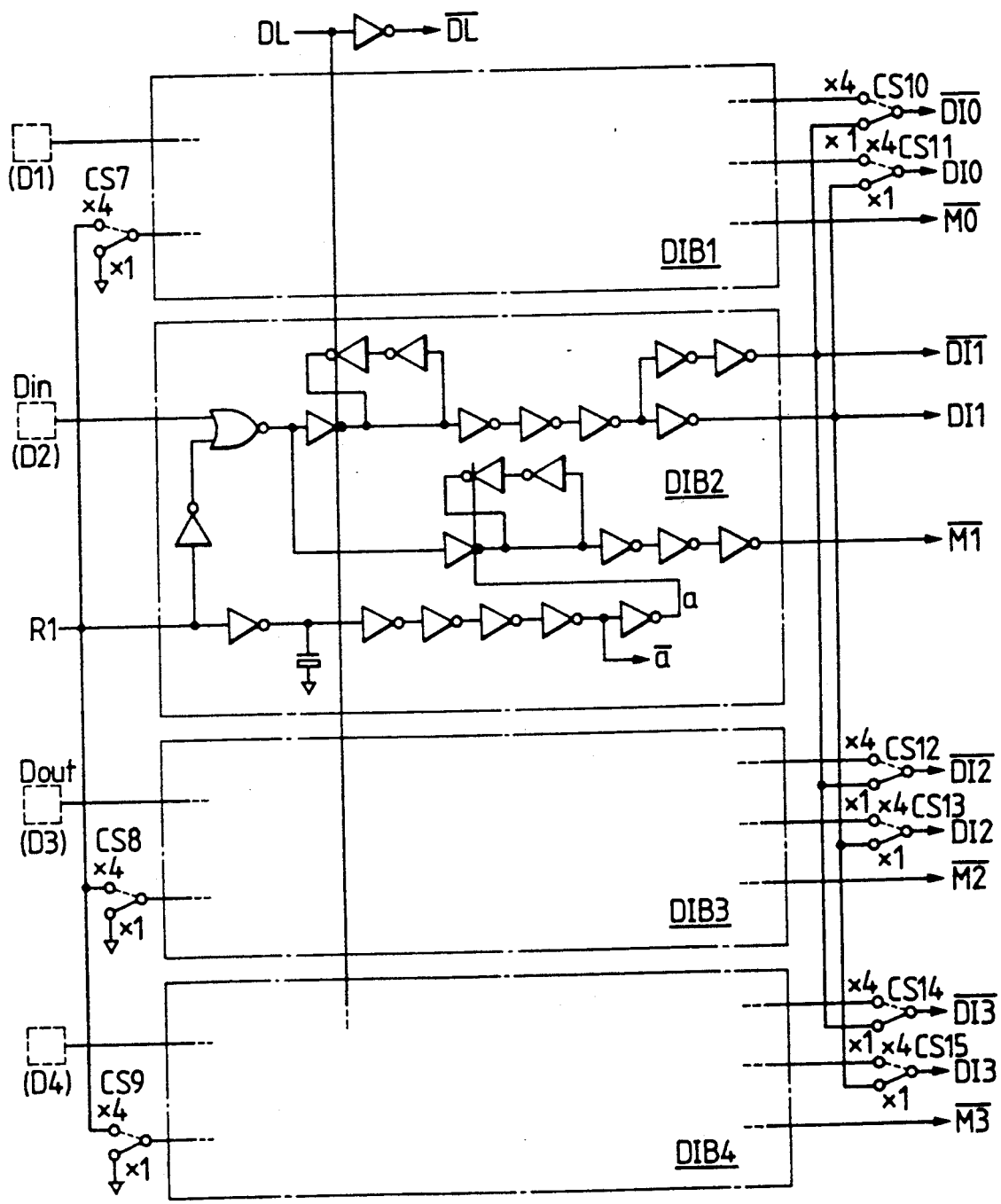
FIG. 21 is a circuit diagram showing one example of a data input buffer of a dynamic type RAM to which the present invention is applied.

On the other hand, each of the data input buffers DIB1 to DIB4 includes a data latch which takes in write data in accordance with the internal control signal DL and a mask data latch which takes in mask data in accordance with the internal control signal R1, as representatively shown in FIG. 21 by the data input buffer DIB2. The internal control signal DL is formed on the basis of the column address strobe signal $\overline{\text{CAS}}$. Thus, when the dynamic type RAM is set in the mask write mode, mask data which is supplied in synchronism with the fall edge of the row address strobe signal $\overline{\text{RAS}}$ is taken into the mask data latch in accordance with the internal control signal R1, while write data which is supplied in synchronism with the fall edge of the column address strobe signal $\overline{\text{CAS}}$ is taken into the data latch in accordance with the internal control signal DL.

The voltage generating circuit VG includes a start signal generating circuit for forming an inverted start signal $\overline{\text{WK}}$ when the power supply is turned on, a substrate back bias voltage generating circuit for forming a substrate back bias voltage VBB, and a VCC/2 voltage generating circuit for forming a cell plate voltage VPL and a half precharge voltage HVC.

Figure 28:
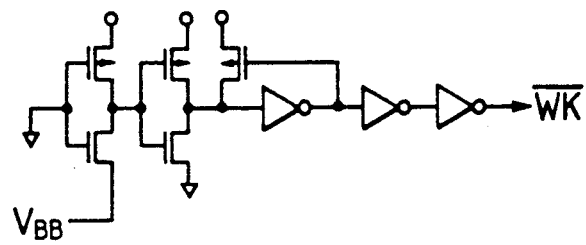
FIGS. 28 to 30 are circuit diagrams showing one example of a voltage generating circuit of a dynamic type RAM to which the present invention is applied.

As shown in FIG. 28, the start signal generating circuit of the voltage generating circuit VG keeps the inverted start signal $\overline{\text{WK}}$ at a high level during the interval from the time when the power supply of the dynamic type RAM is turned on to the time when the substrate back bias voltage VBB reaches a sufficiently low voltage Each of the timing generating circuits of the dynamic type RAM is validated only after the inverted start signal $\overline{\text{WK}}$ is shifted to a low level.

Figure 29:
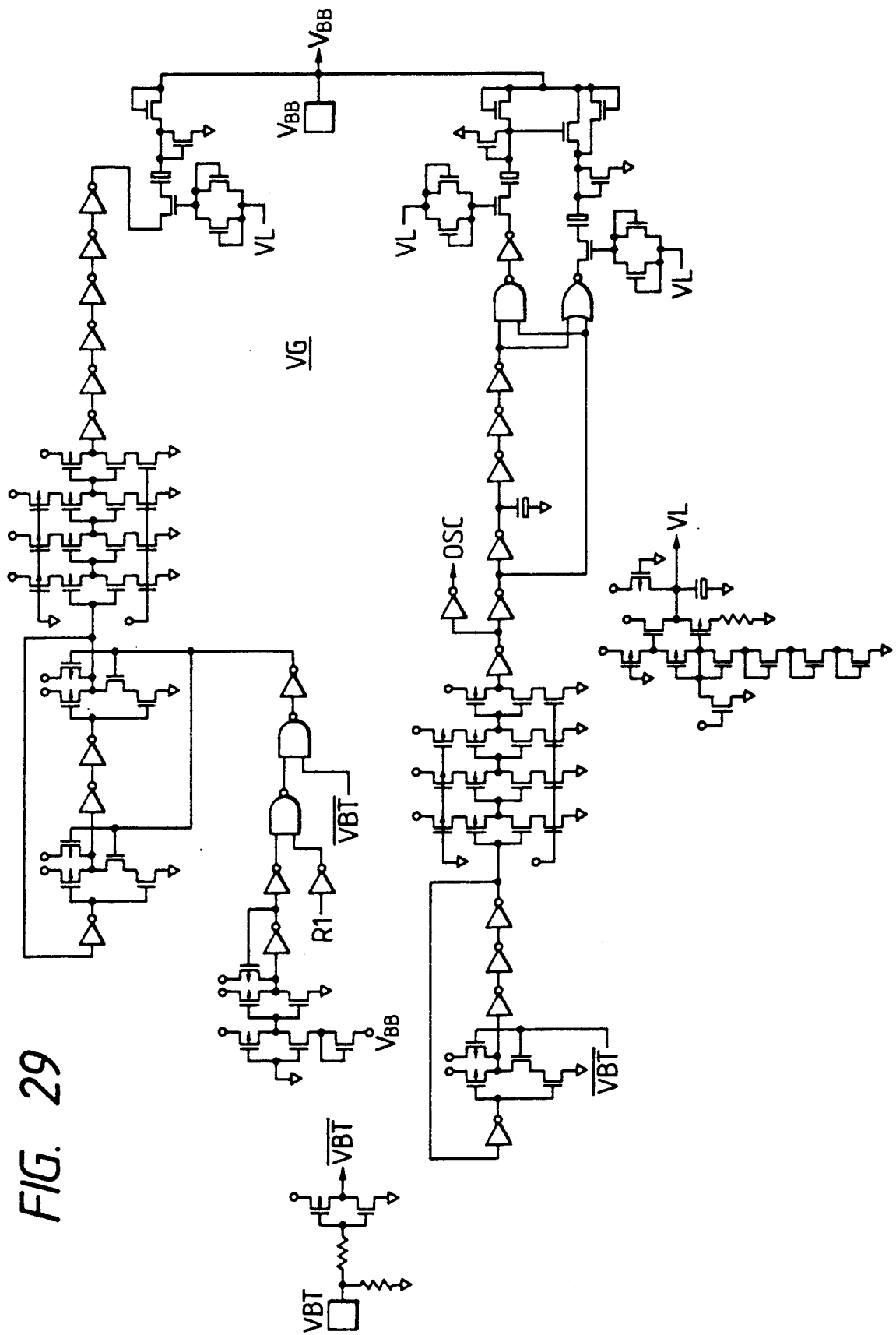

As shown in FIG. 29, the substrate back bias generating circuit of the voltage generating circuit VG includes a first substrate back bias voltage generating circuit having a relatively large current supply capacity and a second substrate back bias voltage generating circuit having a relatively small current supply capacity. Each of the substrate back bias voltage generating circuits includes a ring oscillator having five CMOS inverter circuits and a charge pump circuit formed employing a boost capacitor. The first substrate back bias voltage generating circuit is selectively brought to an operative state in accordance with the internal control signal R1, that is, the row address strobe signal $\overline{\text{RAS}}$, when the dynamic type RAM is brought to a select state. The operations of the first and second substrate back bias voltage generating circuits are forcedly suspended when an inverted testing control signal $\overline{\text{VBT}}$ is supplied through an external terminal VBT. The operation of the first substrate back bias voltage generating circuit is automatically suspended when the substrate back bias voltage VBB becomes lower than a predetermined level.

Figure 30:
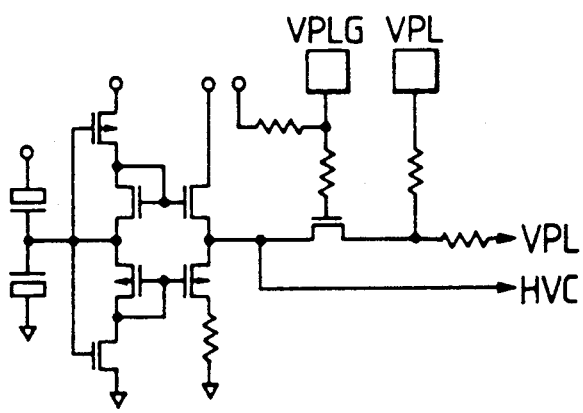

As shown in FIG. 30, the VCC/2 voltage generating circuit of the voltage generating circuit VG forms a voltage which is a half of the power supply voltage Vcc by capacitance-dividing the voltage Vcc and shorting the input and output terminals of the inverter circuit and thus outputs a half precharge voltage HVC and a cell plate voltage VPL. The cell plate voltage VPL can be forcedly cut off by shifting an external terminal VPLG to a low level. At this time, it is possible to test information hold characteristics of the memory cells of the dynamic type RAM by supplying a desired testing cell plate voltage from an external terminal VPL.

The timing generating circuit TG includes a common section COM, a $\overline{RAS}$ timing generating section RTG, a $\overline{CAS}$ timing generating section CTG, $\overline{OE}$ timing generating section OTG and a $\overline{WE}$ timing generating section WTG, although not necessarily limitative thereto.

The common section COM of the timing generating circuit TG includes a mode control circuit for the dynamic type RAM, a testing control circuit, and a timing generating section for forming various kinds of internal control signal in accordance with internal control signals which are supplied from each of the timing generating sections.

Figure 1:
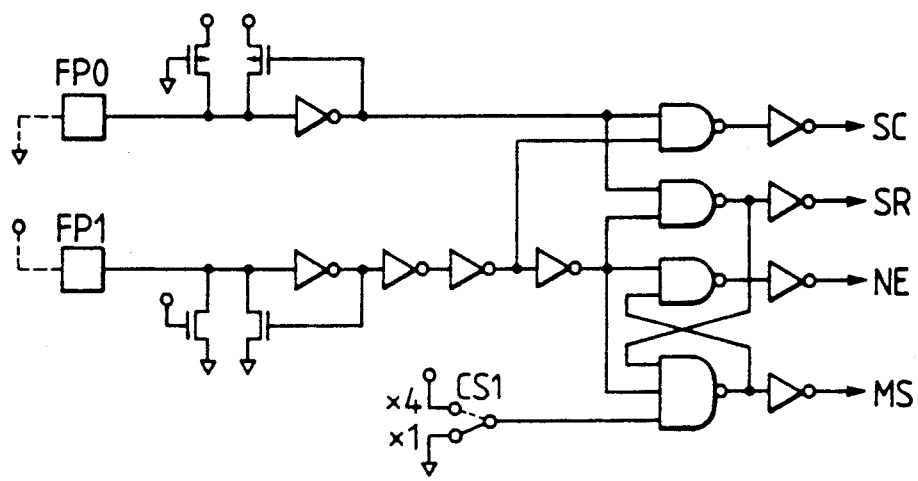
FIGS. 1 to 5 are circuit diagrams each showing one example of a common section of a timing generating circuit of a dynamic type RAM to which the present invention is applied.

As shown in FIG. 1, the mode control circuit of the common section COM in the timing generating circuit TG is arranged such that the mode setting external terminals FP0 and FP1 are conencted to either the circuit ground potential or the power supply voltage Vcc in a predetermined combination, whereby the above-described internal control signals SC, NE, SR and MS are selectively shifted to the high level H or the low level L in the combinations shown in Table 1 below. As described above, the connection between the mode setting external terminals FP0, FP1 on the one hand and the circuit ground potential and the power supply voltage Vcc on the other is made by carrying out bonding between predetermined pads.

TABLE 1

| | Bit patterns | | | | | |
|---|---|---|---|---|---|---|
| | Pads | | Internal control signals | | | |
| Operating modes | FP0 | FP1 | SC | NE | SR | MS |
| x1, x4 | FP | NC | NC | L | L | L | L |
| x1, x4 | SC | Vss | NC | H | L | L | L |
| x1 | N | NC | Vcc | L | H | L | L |
| x4 | MW | NC | Vcc | L | L | L | H |
| x1, x4 | SR | Vss | Vcc | L | H | H | L |

Figure 3:
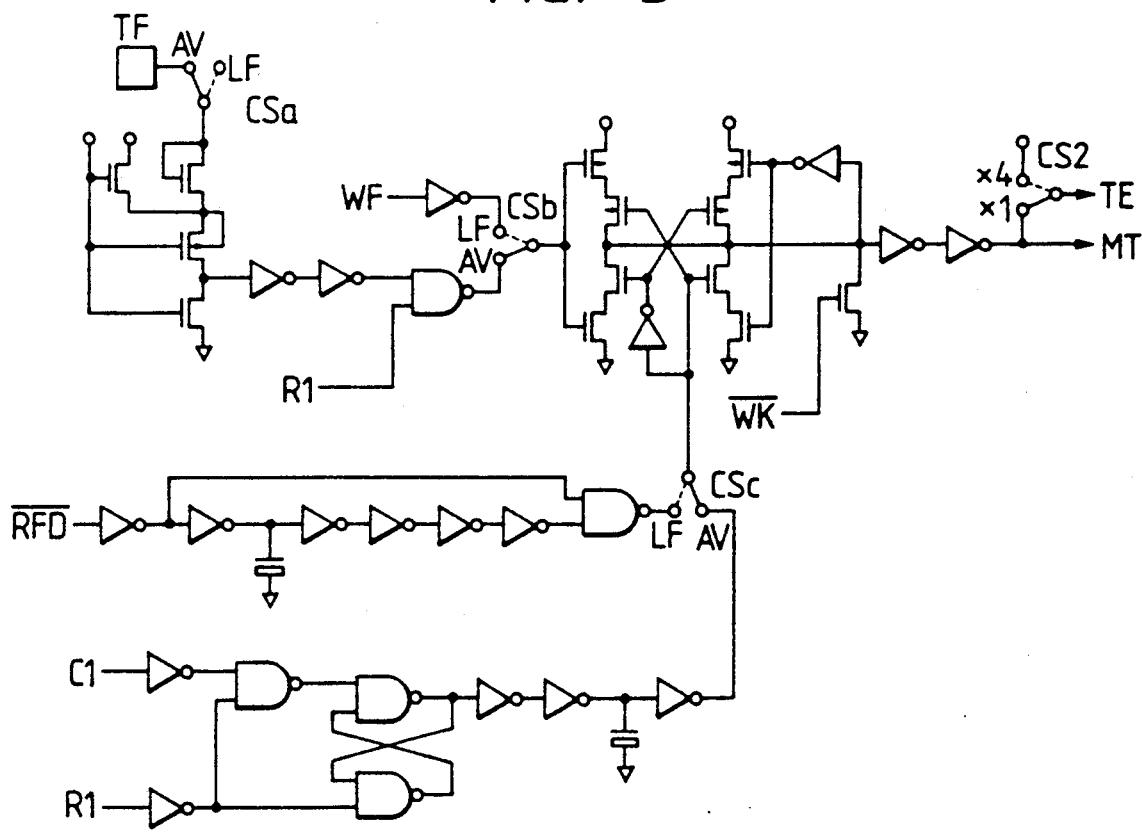
Figure 4:
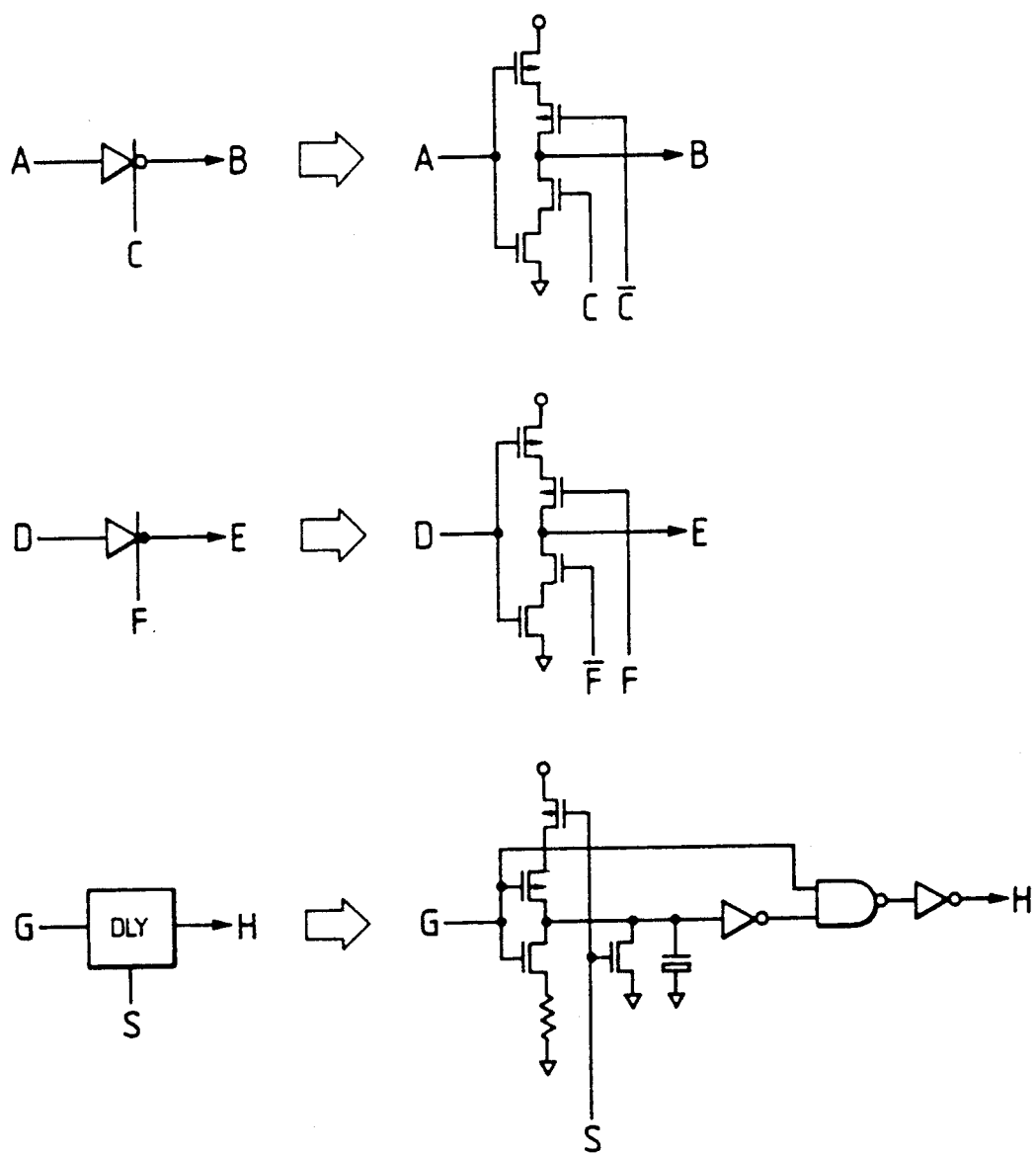

FP ... first page mode
SC ... static column mode
N ... nibble mode
MW ... mask write mode
SR ... serial mode The testing control circuit of the common section COM in the timing generating circuit TG is arranged to selectively form internal control signals TE and MT in accordance with a testing control signal supplied through an external terminal TF, as shown in FIG. 3. The connection switching points CSa to CSc shown in the figure are connected to the LF side when the testing control signal is supplied in the form of a combination of the levels and timings of the row address strobe signal $\overline{RAS}$, the column address strobe signal $\overline{CAS}$ and the write enable signal $\overline{WE}$, whereas, when the testing control signal is supplied in the form of a high voltage which exceeds the power supply voltage, the connection switching points CSa to CSc are connected to the AV side.

Figure 2:
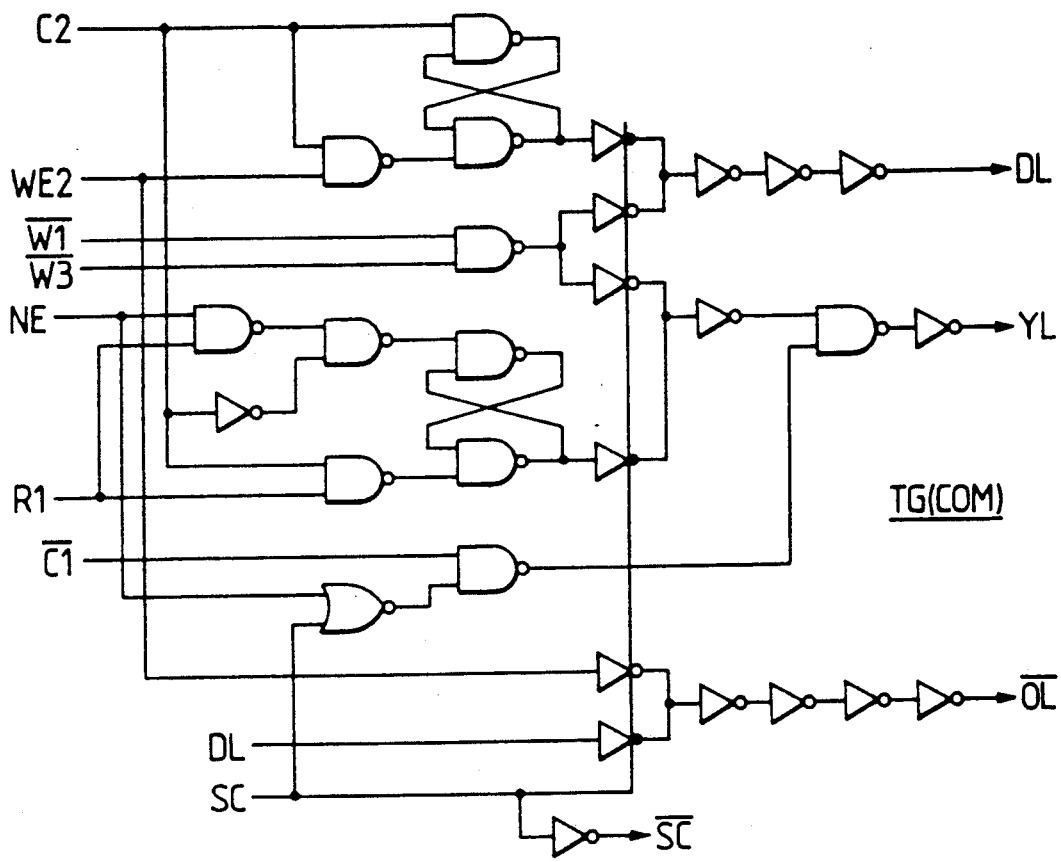
Figure 2:
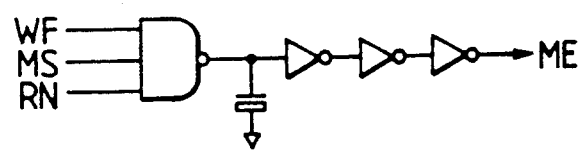
Figure 2:
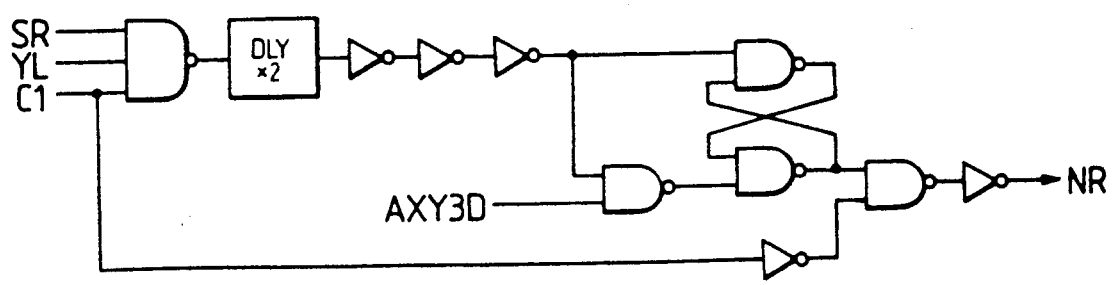
Figure 5:
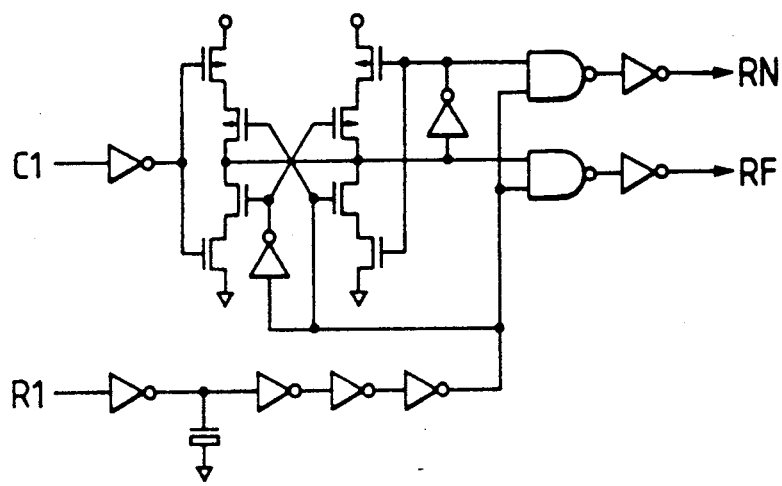
Figure 5:
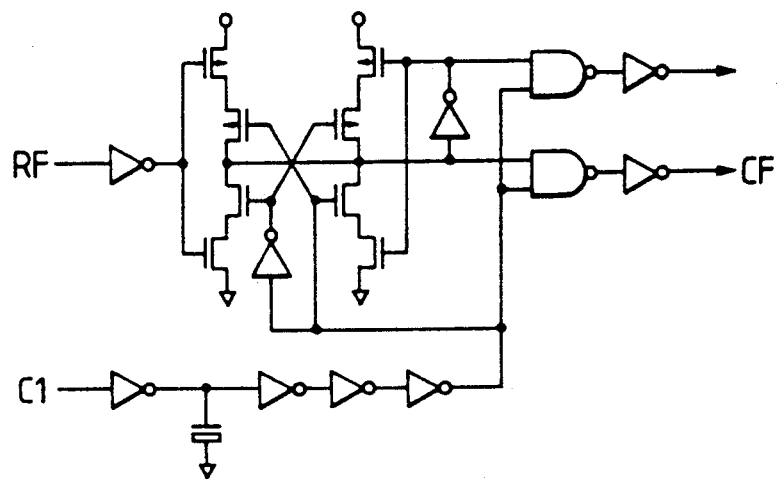
Figure 5:
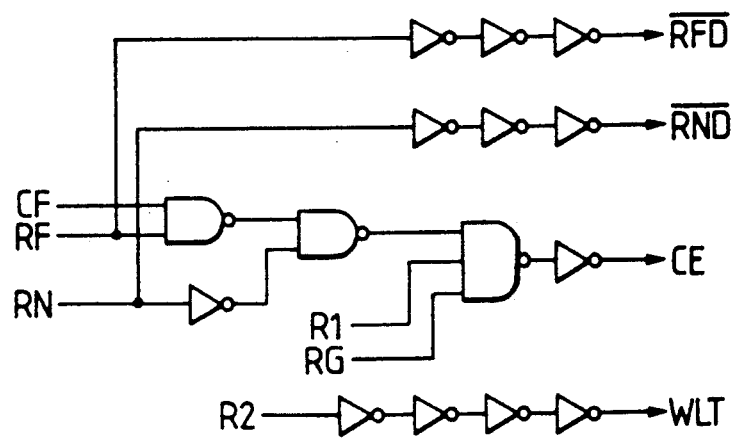

The common section COM of the timing generating circuit TG further includes circuits for generating various internal control signals such as those shown in FIGS. 2 and 5.

Figure 6:
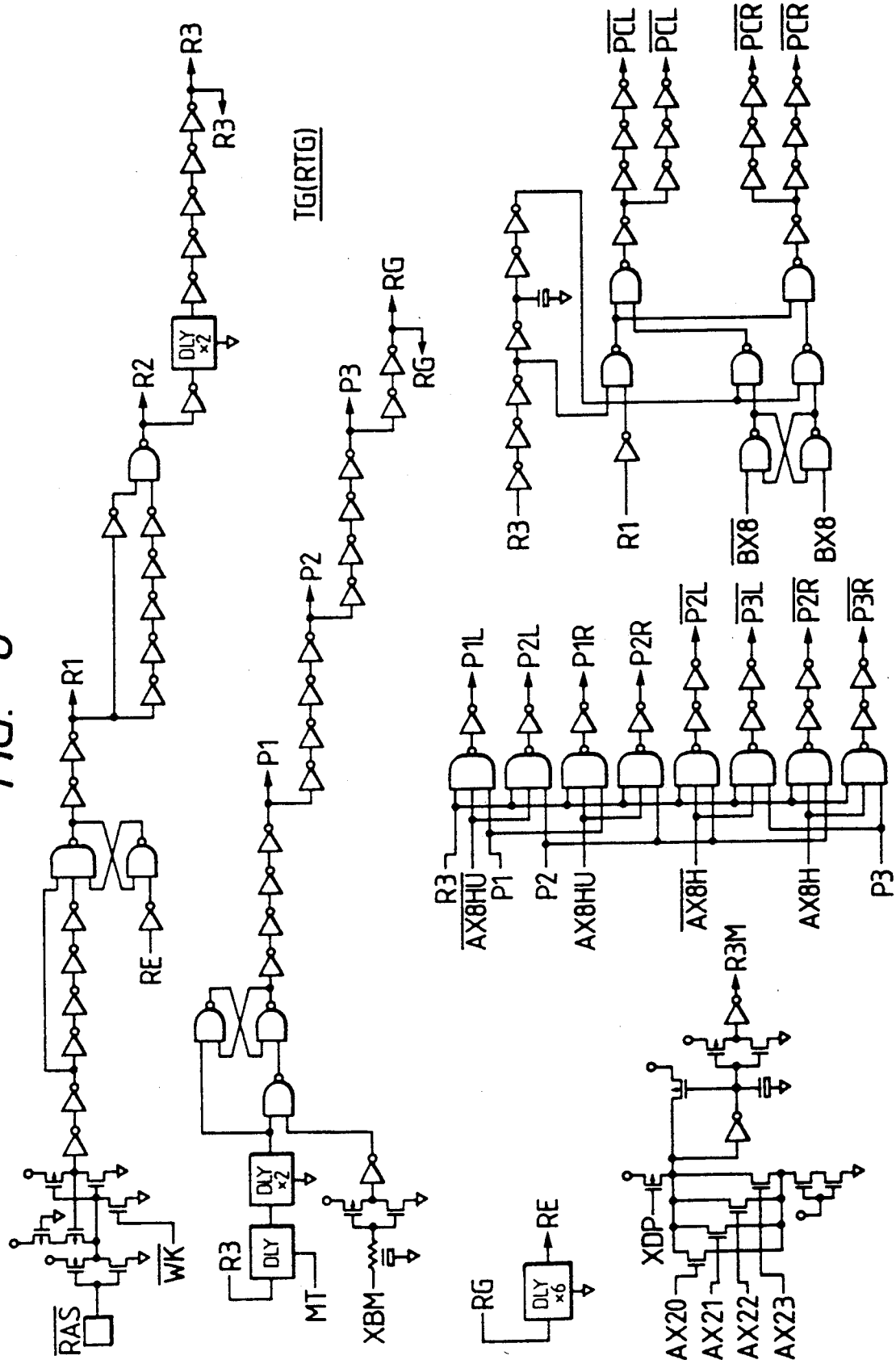
FIG. 6 is a circuit diagram showing one example of a RAS timing generating section of a timing generating circuit of a dynamic type RAM to which the present invention is applied.

As shown in FIG. 6, the $\overline{RAS}$ timing generating section RTG of the timing generating circuit TG forms internal control signals R1 to R3, P1 to P3, RG, RE, R3M, etc. concerning the word line selecting and sense amplifier driving operations on the basis of the row address strobe signal $\overline{RAS}$ which is supplied through the external terminal $\overline{RAS}$. The $\overline{RAS}$ timing generating section RTG further forms internal select signals P1L (P1R) to P2L (P2R) and inverted internal select signals $\overline{P2L}$ ($\overline{P2R}$) to $\overline{P3L}$ ($\overline{P3R}$) for driving the sense amplifiers SAN0 to SAN3 and SAP0 to SAP3 on the basis of the above-described internal control signals R3, P1 to P3 and internal select signals AX8H, $\overline{AX8H}$ and AX8HU, $\overline{AX8HU}$. Further, the $\overline{RAS}$ timing generating section RTG forms inverted internal select signals $\overline{PCL}$ and $\overline{PCR}$ for driving the unit precharge circuits of the sense amplifiers SAN0 to SAN3 on the basis of the above-described internal control signals R1, R3 and complementary internal address signal BX8.

Figure 7:
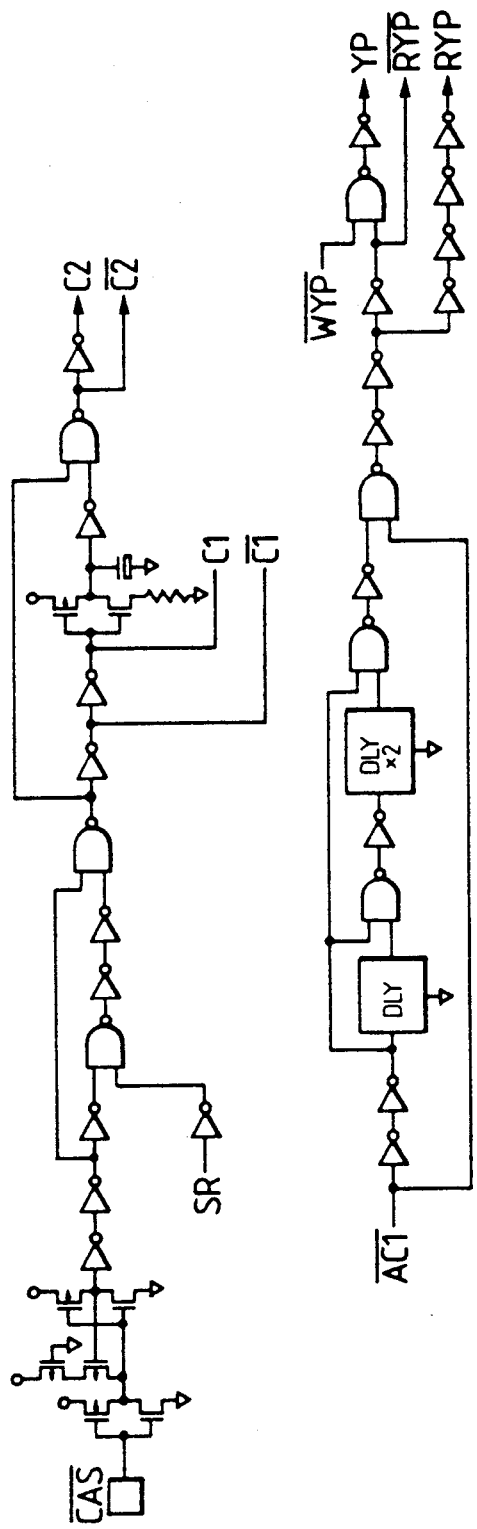
FIG. 7 is a circuit diagram showing one example of a CAS timing generating section of a timing generating circuit of a dynamic type RAM to which the present invention is applied.

As shown in FIG. 7, the $\overline{CAS}$ timing generating circuit CTG of the timing generating circuit TG forms various internal control signals C1, $\overline{C1}$, C2, $\overline{C2}$, YP, RYP, $\overline{RYP}$, MA, DS, etc. concerning the data line selecting and main amplifier driving operations on the basis of the column address strobe signal $\overline{CAS}$ which is supplied through the external terminal $\overline{CAS}$.

Figure 8:
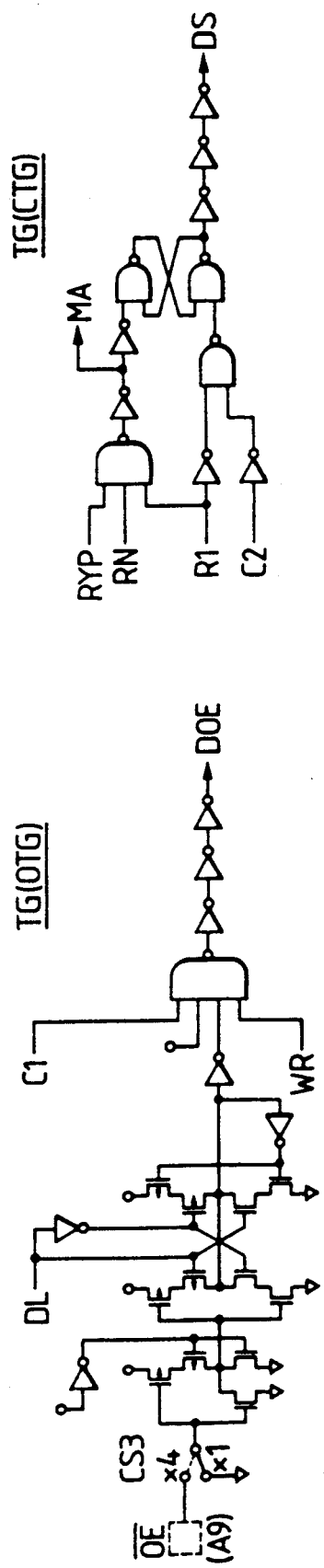
FIG. 8 is a circuit diagram showing one example of an OE timing generating section of a timing generating circuit of a dynamic type RAM to which the present invention is applied.

As shown in FIG. 8, the $\overline{OE}$ timing generating circuit OTG of the timing generating circuit TG forms an internal control signal DOE concerning the data output operation on the basis of the output enable signal $\overline{OE}$ which is supplied through the external terminal $\overline{OE}$. When the dynamic type RAM of this example is adapted for the ×1 bit pattern, the external terminal $\overline{OE}$ is used as an address input terminal A9 for the most significant bit, although not necessarily limitative thereto. Accordingly, the $\overline{OE}$ timing generating circuit OTG is selectively validated by changing the connection of the connection switching point CS3 by means of a photomask.

Figure 9:
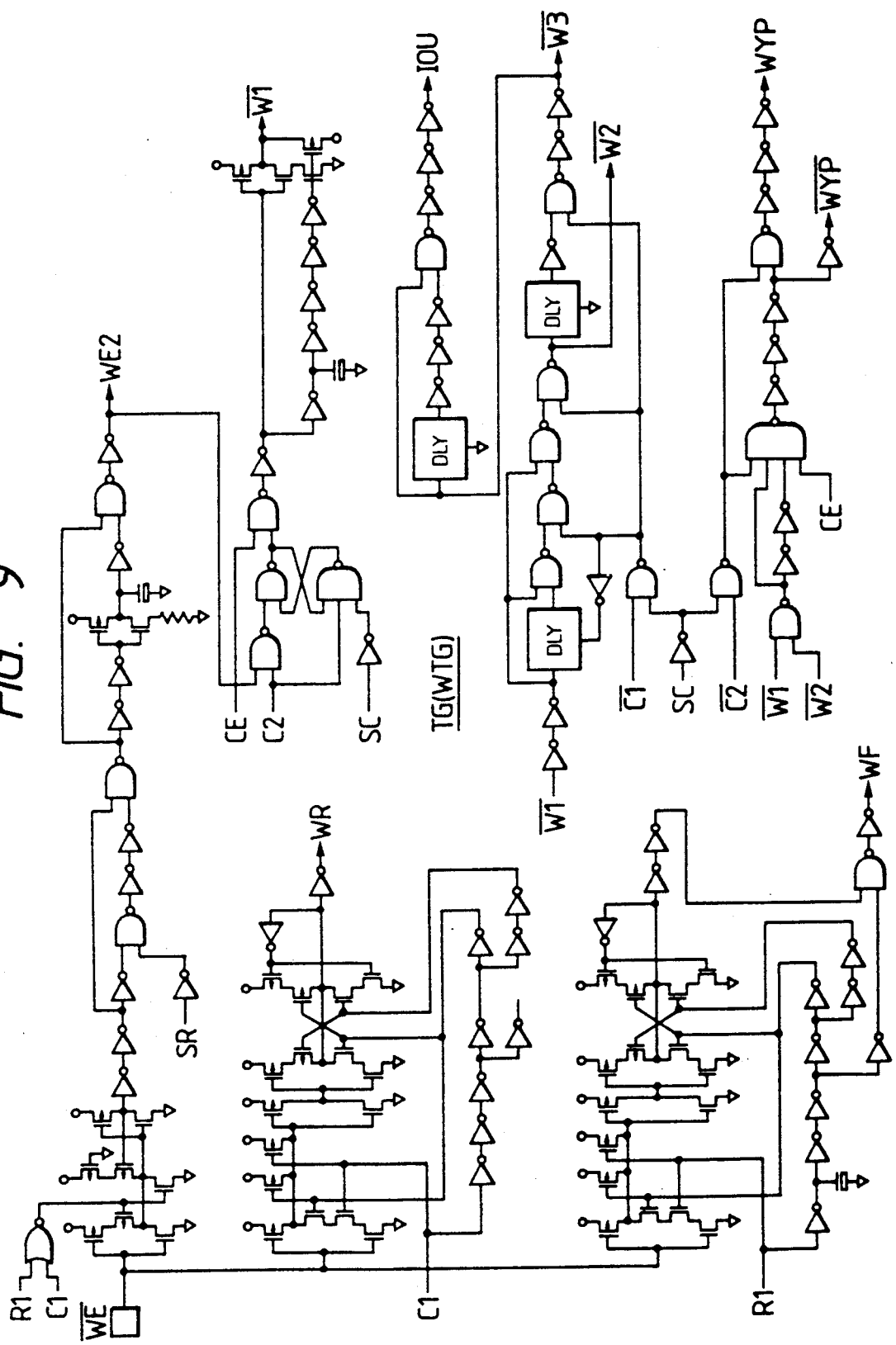
FIG. 9 is a circuit diagram showing one example of a WE timing generating section of a timing generating circuit of a dynamic type RAM to which the present invention is applied.

As shown in FIG. 9, the $\overline{WE}$ timing generating circuit WTG of the timing generating circuit TG forms various internal control signals WE2, WR, WF, IOU, $\overline{W1}$ to $\overline{W3}$, WYP, $\overline{WYP}$, etc. concerning the write operation on the basis of the write enable signal $\overline{WE}$ which is supplied through the external terminal $\overline{WE}$.

Figure 33:
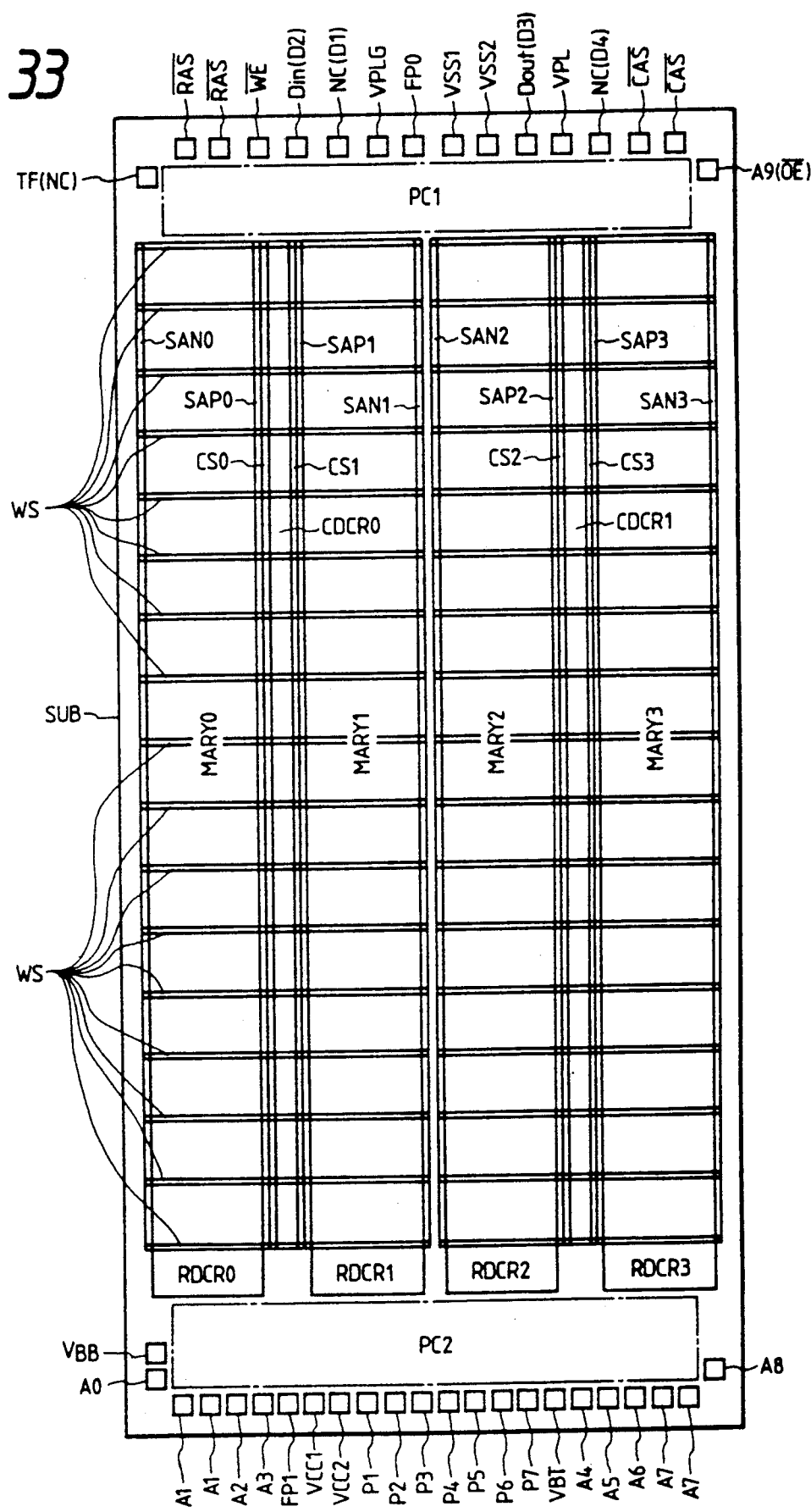
FIG. 33 shows the arrangement of one example of a dynamic type RAM to which the present invention is applied.

FIG. 33 shows the arrangement of one example of the dynamic type RAM shown in FIG. 32.

Referring to FIG. 33, the dynamic type RAM is, although not necessarily limitative, formed on a semiconductor substrate SUB which is defined by one single crystal silicon. The memory arrays MARY0 to MARY3 are disposed in the center of the semiconductor substrate SUB, and the sense amplifiers SAN0 to SAN3, SAP0 to SAP3, column switches CS0 to CS3, column address decoders CDCR0, CDCR1 and row address decoders RDCR0 to RDCR3, which correspond to the memory arrays MARY0 to MARY3, respectively, are disposed in a predetermined combination.

In the dynamic type RAM of this example, the word lines constituting each memory array is divided into 16 sections in the direction in which the word lines extend, although not necessarily limitative thereto. Memory cells in each memory array are coupled to the divided word lines made of a polycide and further coupled to the corresponding main word lines at word shunt sections WS. The main word lines are formed from an aluminum layer. Clearing MOSFETs which are provided in correspondence with the word lines are additionally disposed at the uppermost word shunt section WS.

At one end of the semiconductor substrate SUB, the pads TF to A9 are disposed in a predetermined order, and a peripheral circuit PC1 which includes the timing generating circuit TG, the data input buffers DIB1 to DIB4, the data output buffers DOB1 to DOB4, etc. is disposed between the pads TF to A9 and the memory arrays MARY0 to MARY3. At the other end of the semiconductor substrate SUB, the pads A0 to A8 are disposed in a predetermined order, and a peripheral circuit PC2 which includes the row address buffer RADB, the column address buffer CADB, the redundant address control circuit RAC, etc. is disposed between the pads A0 to A8 and the memory arrays MARY0 to MARY3.

As described above, the dynamic type RAM of this example allows selection of two different kinds of bit pattern and a total of five different kinds of operating mode on the basis of a single common semiconductor substrate (base chip). A change of the bit patterns from one to the other, which necessitates alteration of the input/output path of storage data, is effected by selectively using two different kinds of photomask which are prepared in advance. Changing these photomasks from one to the other enables switching and alteration of the connections at the connection switching points CS1 to CS17 provided in the various circuits. On the other hand, a change of operating modes from one to another, which has a relatively small effect on the storage data input/output path, is effected by bonding the mode setting external terminals FP0 and FP1 provided on the common section COM of the timing generating circuit TG to either the circuit ground potential or the power supply voltage Vcc in a predetermined combination. Thus, the dynamic type RAM of this example enables a change of bit pattern from one to the other without lowering the operating characteristics and also permits a reduction in the number of pads required to change over operating modes from one to another. Accordingly, it is possible to realize efficient expansion of type while optimizing the arrangement of the dynamic type RAM and ensuring predetermined operating characteristics.

EXAMPLE 2

Figure 31:
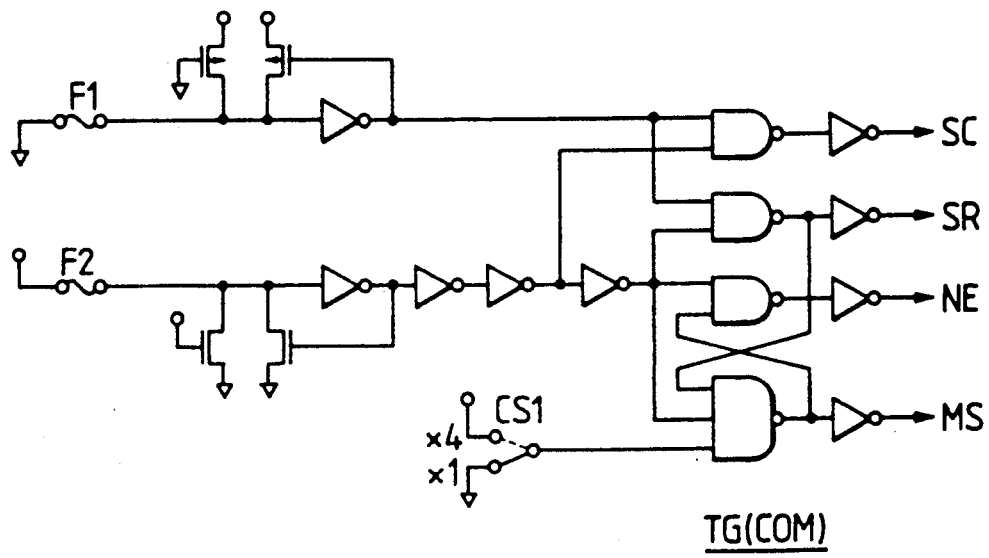
FIG. 31 is a circuit diagram showing another example of a common section of a timing generating circuit of a dynamic type RAM to which the present invention is applied.

FIG. 31 is a circuit diagram showing another example of a common section COM of a timing generating circuit TG in a dynamic type RAM to which the present invention is applied. Each of the other blocks (not shown) of the dynamic type RAM according to this example has the same circuit configuration and performs the same function as in the case of the dynamic type RAM of the above-described EXAMPLE 1; therefore, the illustration and description thereof are omitted.

The dynamic type RAM of this example is designed so that the bit pattern is selectively set so as to be either the ×1 bit pattern or the ×4 bit pattern by selectively using two different kinds of phtomask which are prepared in advance, in the same way as in the case of the dynamic type RAM of the above-described EXAMPLE 1. Further, one of the operating modes is selectively designated by cutting off two fuse means F1 and F2 in a predetermined combination.

Referring to FIG. 31, the mode control circuit of the common section COM in the timing generating circuit TG is arranged such that the internal control signals SC, NE, SR and MS are selectively shifted to the high level H or the low level L in the combinations shown in Table 2 below by cutting off the mode setting fuse means F1 and F2 in a predetermined combination. As a result, the dynamic type RAM of this example enables an operating mode to be selectively set in the same way as in the case of the dynamic type RAM of the above-described EXAMPLE 1.

TABLE 2

| | | Bit patterns | | | | |
| | | Fuses | | Internal control signals | | | |
| Operating modes | | F1 | F2 | SC | NE | SR | MS |
|---|---|---|---|---|---|---|---|
| x1, x4 | FP | cut | cut | L | L | L | L |
| x1, x4 | SC | — | cut | H | L | L | L |
| x1 | N | cut | — | L | H | L | L |
| x4 | MW | cut | — | L | L | L | H |
| x1, x4 | SR | — | — | L | H | H | L |

FP ... first page mode
SC ... static column mode
N ... nibble mode
MW ... mask write mode
SR ... serial mode On the other hand, the dynamic type RAM of this example is selectively adapted for either the ×1 bit pattern or the ×4 bit pattern by selectively using two different kinds of phtomask which are prepared in advance, as described above. These photomask have respective arrangements which are partially different from each other at a plurality of connection switching points as representatively shown in FIG. 31 by the connection switching point CS1. When one photomask with which the solid-line connection is made at each connection switching point is used, the dynamic type RAM is adapted for the ×1 bit pattern, whereas, when the other photomask with which the chain-line connection is made is used, the dynamic type RAM is adapted for the ×4 bit pattern.

As described above, the dynamic type RAM of this example enables an operating mode to be selectively set by cutting off two fuse means F1 and F2 in a predetermined combination which are provided in the common section COM of the timing generating circuit TG and also permits either the ×1 bit pattern or the ×4 bit pattern to be selectively set by selectively using two different kinds of photomask which are prepared in advance. As a result, the dynamic type RAM of this example provides advantages which are similar to those offered by the dynamic type RAM of the above-described EXAMPLE 1. Thus, it is possible to realize efficient expansion of type while optimizing the arrangement of the dynamic type RAM and ensuring predetermined operating characteristics.

As shown in the foregoing two examples, the following advantages are obtained by applying the present invention to a semiconductor memory such as a dynamic type RAM or the like which is designed so that it is possible to achieve expansion of type on the basis of a common semiconductor substrate (base chip):

(1) An operating mode of a dynamic type RAM or the like is set by effecting bonding between predetermined pads on a common semiconductor substrate (base chip) in a predetermined combination or cutting off predetermined fuse means is a predetermined combination, so that a change of operating modes from one to another, which has a relatively small effect on the input/output path of storage data, can be effected without the need to change photomasks, that is, without wastefully increasing the number of photomasks which are to be prepared.

(2) A bit pattern of a dynamic type RAM or the like is set by changing a part of a photomask applied to a common semiconductor substrate, so that a change of bit patterns, which necessitates alteration of the input/output path of storage data, can be effected without lowering the operating characteristics of the dynamic type RAM or the like and without the need to wastefully increase the number of bonding pads installed.

(3) The above-described advantages (1) and (2) enable in combination efficient expansion of type of a dynamic type RAM or the like without lowering operating characteristics, for example, access time.

Although the invention accomplished by the present inventors has been described specifically by way of examples, it should be noted here that the present invention is not necessarily limitative to the described examples and various changes and modifications may, of coruse, be imparted thereto without departing from the gist of the invention. For example, although in the dynamic type RAM of the first example an operating mode is set simply by selectively effecting bonding between the mode setting pads FP0 and FP1 on the one hand and the circuit ground potential and the power supply voltage on the other and in the dynamic type RAM of the second example an operating mode is set simply by selectively cutting off the mode setting fuse means F1 and F2, these two different kinds of means, that is, the bonding of the mode setting pads and the cutting of the fuse means, may be combined together. The positions of the connection switching points CS1 to CS17 for changing bit patterns from one to the other are not necessarily limitative to those shown in the examples. It is also possible to increase the number of connection switching points according to need. The number of kinds of bit pattern and that of operating mode may be increased or decreased as desired. Further, the circuit block arrangement of the dynamic type RAM shown in FIG. 32, the specific arrangement of the various circuits shown in FIGS. 1 to 30 and FIG. 31, the chip layout shown in FIG. 33, and the combinations of address signals, internal control signals, internal select signals, etc. are not necessarily limitative thereto but may be embodied in various other forms.

Although the invention accomplished by the inventors of the present application has been described mainly by way of one example in which it is applied to a dynamic type RAM which is the background applicable field thereof, it should be noted that the present invention is not necessarily limitative thereto. For example, the present invention may also be applied to various other types of semiconductor memory such as static type RAMs. The present invention may be widely applicable to semiconductor memories which are, at least, designed so that expansion of type is enabled on the basis of a common semiconductor substrate (base chip) and to digital devices including such semiconductor memories.

What is claimed is:

1. A semiconductor memory having a plurality of operating modes comprising:
    a plurality of pads which correspond in a predetermined manner to a plurality of output circuits;
    first connecting means for coupling said output circuits and corresponding pads selectively on the basis of an output bit pattern of said semiconductor memory;
    a signal generator for delivering control signals for specifying said predetermined one of said operation modes; and
    a first input pad which corresponds to said signal generator and which serves to couple a predetermined voltage to said signal generator for controlling said signal generator,
    wherein said first connecting means is provided by a first conductive layer formed on a semiconductor substrate, and wherein said first input pad is connected to said predetermined voltage by effecting wire bonding.

2. A semiconductor memory according to claim 1, further comprising:
    a plurality of input circuits being provided which correspond in a predetermined manner to said plurality of pads; and
    second connecting means for coupling said input circuits and corresponding pads selectively on the basis of said output bit pattern of said semiconductor memory,
    wherein said second connecting means is provided by a second conductive layer formed on a semiconductor substrate.

3. A semiconductor memory according to claim 2, further comprising:
    a second input pad which corresponds to said signal generator and which serves to couple a predetermined voltage to said signal generator for controlling said signal generator.

4. A semiconductor memory according to claim 3, wherein said first input pad or said second input pad is coupled to a circuit ground potential or a power supply voltage.

5. A semiconductor memory according to claim 4, wherein said semiconductor memory is a dynamic random access memory.

6. A semiconductor memory according to claim 4, wherein said semiconductor memory is formed on a common semiconductor substrate.

* * * * *